US012622168B2

(12) United States Patent
Kim et al.

(10) Patent No.: US 12,622,168 B2
(45) Date of Patent: May 5, 2026

(54) ORGANIC LIGHT EMITTING DIODE AND ORGANIC LIGHT EMITTING DEVICE INCLUDING THEREOF

(71) Applicant: LG Display Co., Ltd., Seoul (KR)

(72) Inventors: Gyeong-Woo Kim, Paju-si (KR); Joon-Beom Im, Paju-si (KR); Han-Jin Ahn, Paju-si (KR); Jun-Yun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 770 days.

(21) Appl. No.: 17/976,394

(22) Filed: Oct. 28, 2022

(65) Prior Publication Data

US 2023/0200228 A1 Jun. 22, 2023

(30) Foreign Application Priority Data

Dec. 17, 2021 (KR) ........................ 10-2021-0182140

(51) Int. Cl.

| | |
|---|---|
| ***H10K 85/60*** | (2023.01) |
| ***H10K 85/30*** | (2023.01) |
| *H10K 50/13* | (2023.01) |

(52) U.S. Cl.

CPC ......... *H10K 85/654* (2023.02); *H10K 85/346* (2023.02); *H10K 85/626* (2023.02); *H10K 85/6572* (2023.02); *H10K 85/658* (2023.02); *H10K 50/13* (2023.02)

(58) Field of Classification Search

CPC .. H10K 85/654; H10K 85/658; H10K 85/626; H10K 85/6572; H10K 85/346; H10K 85/322; H10K 85/636; H10K 50/12; H10K 50/13

USPC .......................................................... 428/690

See application file for complete search history.

(56) References Cited

U.S. PATENT DOCUMENTS

| | | | | |
|---|---|---|---|---|
| 2021/0280811 | A1 | 9/2021 | Ohsawa et al. | |
| 2022/0209120 | A1* | 6/2022 | Choi .................... | H10K 85/657 |

FOREIGN PATENT DOCUMENTS

| | | | |
|---|---|---|---|
| KR | 10-2010-0113081 | A | 10/2010 |
| KR | 10-2020-0081984 | A | 7/2020 |
| KR | 10-2020-0095395 | A | 8/2020 |
| KR | 10-2021-0030278 | A | 3/2021 |
| KR | 10-2021-0048977 | A | 5/2021 |

* cited by examiner

*Primary Examiner* — James D Sells

(74) *Attorney, Agent, or Firm* — Birch, Stewart, Kolasch & Birch, LLP

(57) ABSTRACT

An organic light emitting diode (OLED) is described, which comprises at least one emitting material (EML) disposed between two electrodes. The EML can comprise a first emitting material layer having a first compound and a second compound of phosphorescent material, and a second emitting material layer having a third compound with triplet-triplet-annihilation property and a fourth compound. Further, an organic light emitting device can comprise the OLED. With the luminous materials with adjusted excited singlet/triplet energy levels, the intensities of emission peaks and full-width at quarter maximum applied into the emitting material layer, the driving voltage of the OLED can be reduced and the luminous efficiency, blue index and luminous lifespan of the OLED can be enhanced.

22 Claims, 19 Drawing Sheets

D1

ORGANIC LIGHT EMITTING DIODE AND ORGANIC LIGHT EMITTING DEVICE INCLUDING THEREOF

CROSS-REFERENCE TO RELATED APPLICATIONS

This application claims the priority benefit under 35 U.S.C. § 119(a) to Korean Patent Application No. 10-2021-0182140, filed in the Republic of Korea on Dec. 17, 2021, the entire contents of which are incorporated herein by reference into the present application.

BACKGROUND

Technical Field

The present disclosure relates to an organic light emitting diode, and more specifically, to an organic light emitting diode having excellent color purity and luminous lifespan and an organic light emitting device having the organic light emitting diode.

Discussion of the Related Art

As display devices have become larger, there exists a need for a flat display device, which take up less space. Among the flat display devices, a display device using an organic light emitting diode (OLED) has come into the spotlight.

The OLED can be formed as a thin film having a thickness less than 2000 Å and can be used to implement unidirectional or bidirectional images as electrode configurations. Also, the OLED can be formed on a flexible transparent substrate such as a plastic substrate so that OLED can be used in a flexible or foldable display with ease. In addition, the OLED has advantages over liquid crystal display devices (LCD devices); for example, the OLED can be driven at a low voltage and has very high color purity.

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state.

Luminescent materials such as fluorescent and phosphorescent materials have been used in OLEDs. Of these, fluorescent materials from the related art have shown low luminous efficiency, because only the singlet excitons are involved in the luminescence process thereof. Phosphorescent materials, in which triplet excitons as well as the singlet excitons are involved in the luminescence process have relatively high luminous efficiency compared to the fluorescent material.

However, many metal complexes from the prior art, which are used as phosphorescent materials may have a luminous lifespan that is too short for many commercial devices. In particular, blue phosphorescent materials, which have a longer triplet lifetime compared to blue fluorescent materials, have short luminous lifespan as the triplet energy level thereof increases. Accordingly, the blue phosphorescent materials with relatively high triplet energy level for inducing deep blue color light can have a disadvantage of reduced luminous lifespan.

SUMMARY OF THE DISCLOSURE

Accordingly, embodiments of the present disclosure are directed to an OLED and an organic light emitting device including the OLED that substantially obviates one or more of the problems due to the limitations and disadvantages of the related art.

An aspect of the present disclosure is to provide an OLED having high color purity for inducing deep blue color light as well as improved luminous lifespan and an organic light emitting device including the diode.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

To achieve these and other aspects of the inventive concepts, as embodied and broadly described, an organic light emitting diode can comprise a first electrode; a second electrode facing the first electrode; and an emissive layer disposed between the first and second electrodes and comprising at least one emitting material layer, wherein the at least one emitting material layer comprises a first emitting material layer and a second emitting material layer disposed adjacently to the first emitting material layer, wherein the first emitting material layer comprises a first compound having the following structure of Formula 1 and a second compound having the following structure of Formula 3, and wherein the second emitting material layer comprises a third compound having the following structure of Formula 5 and a fourth compound having the following structure of Formula 7:

[Formula 1]

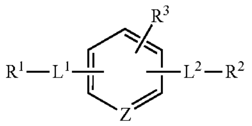

wherein, in Formula 1, each of $R^1$ and $R^2$ is independently an unsubstituted or substituted carbazolyl or an unsubstituted or substituted carboline;

$R^3$ is hydrogen, cyano, unsubstituted or substituted $C_1$-$C_{20}$ alkyl, unsubstituted or substituted $C_6$-$C_{30}$ aryl or unsubstituted or substituted $C_3$-$C_{30}$ hetero aryl;

Z is N or $CR^4$, wherein $R^4$ is hydrogen, unsubstituted or substituted $C_1$-$C_{10}$ alkyl, unsubstituted or substituted $C_6$-$C_{30}$ aryl or unsubstituted or substituted $C_3$-$C_{30}$ hetero aryl; and each of $L^1$ and $L^2$ is independently a single bond, unsubstituted or substituted $C_6$-$C_{30}$ arylene or unsubstituted or substituted $C_3$-$C_{30}$ hetero arylene,

[Formula 3]

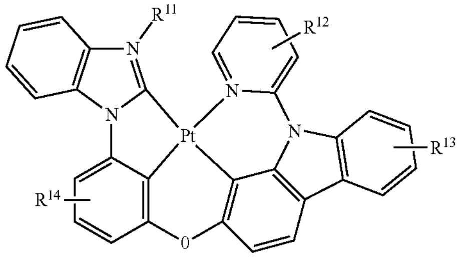

wherein, in Formula 3, each of $R^{11}$ to $R^{14}$ is independently hydrogen, halogen, cyano, unsubstituted or substituted $C_1$-$C_{10}$ alkyl, unsubstituted or substituted $C_1$-$C_{10}$ alkyl amino, unsubstituted or substituted $C_6$-$C_{30}$ aryl, unsubstituted or substituted $C_3$-$C_{30}$ hetero aryl or unsubstituted or substituted adamantyl,

[Formula 5]

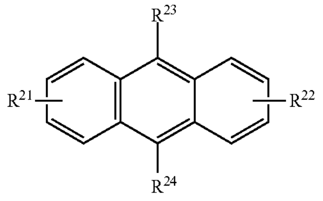

wherein, in Formula 5, each of $R^{21}$ and $R^{22}$ is independently hydrogen, unsubstituted or substituted $C_1$-$C_{20}$ alkyl, unsubstituted or substituted $C_6$-$C_{30}$ aryl or unsubstituted or substituted $C_3$-$C_{30}$ hetero aryl; and each of $R^{23}$ and $R^{24}$ is independently an unsubstituted or substituted $C_6$-$C_{30}$ aryl or unsubstituted or substituted $C_3$-$C_{30}$ hetero aryl,

[Formula 7]

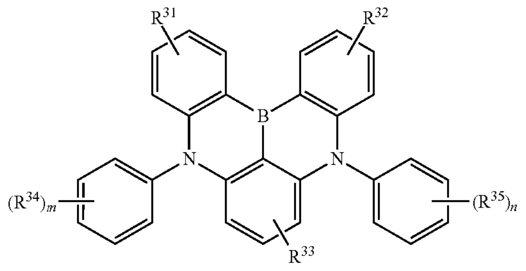

wherein, in Formula 7, each of $R^{31}$ to $R^{33}$ is independently hydrogen, halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino;

each of $R^{34}$ and $R^{35}$ is independently halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino, wherein $R^{34}$ is identical to or different from each other when m is an integer of two or more and each $R^{35}$ is identical to or different from each other when n is an integer of two or more; and each of m and n is independently an integer of 0 to 5.

In an embodiment, an organic light emitting diode can comprise a first electrode; a second electrode facing the first electrode; and an emissive layer disposed between the first and second electrodes and comprising at least one emitting material layer, wherein the at least one emitting material layer comprises a first emitting material layer and a second emitting material layer, wherein the second emitting material layer is disposed adjacently to the first emitting material layer, wherein the first emitting material layer comprises a first compound having the following structure of Formula 1 and a second compound having the following structure of Formula 3, and wherein the second emitting material layer comprises a third compound having the following structure of Formula 5 and a fourth compound having the following structure of Formula 7:

[Formula 1]

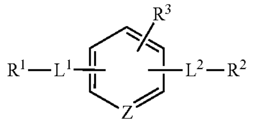

wherein, in Formula 1, each of $R^1$ and $R^2$ is independently an unsubstituted or substituted carbazolyl;

$R^3$ is hydrogen, cyano, an unsubstituted or substituted phenyl, an unsubstituted or substituted pyridyl, or an unsubstituted or substituted $C_1$-$C_4$ alkyl;

Z is N or $CR^4$, wherein $R^4$ is hydrogen or unsubstituted or substituted $C_1$-$C_4$ alkyl; and each of $L^1$ and $L^2$ is independently a single bond, unsubstituted or substituted carbazolyl or an unsubstituted or substituted phenyl,

[Formula 3]

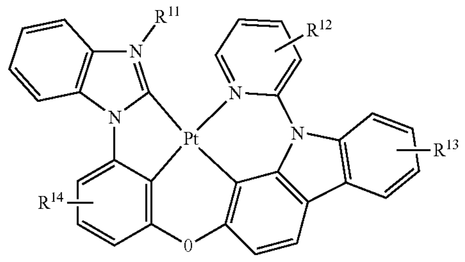

wherein, in Formula 3, each of $R^{11}$ to $R^{14}$ is independently hydrogen, halogen, cyano, unsubstituted or substituted $C_1$-$C_4$ alkyl, unsubstituted or substituted phenyl, unsubstituted or substituted pyridyl, or unsubstituted or substituted adamantyl,

[Formula 5]

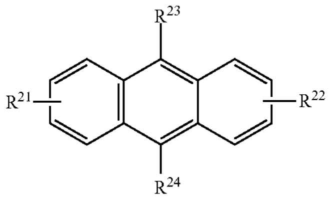

wherein, in Formula 5, each of $R_{21}$ and $R_{22}$ is independently hydrogen, unsubstituted or substituted $C_1$-$C_8$ alkyl, or unsubstituted or substituted $C_6$-$C_{10}$ aryl; and each of $R^{23}$ and $R^{24}$ is independently unsubstituted or substituted $C_6$-$C_{30}$ aryl,

[Formula 7]

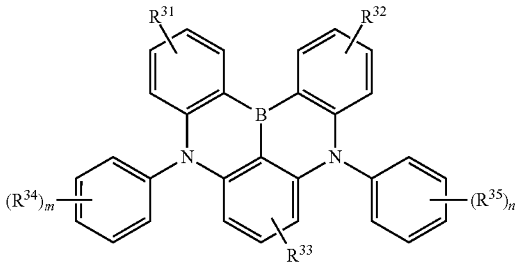

wherein, in Formula 7, each of $R^{31}$ to $R^{33}$ is independently hydrogen, unsubstituted or substituted $C_1$-$C_{20}$ alkyl, or unsubstituted or substituted $C_6$-$C_{30}$ aryl amino;

each of $R^{34}$ and $R^{35}$ is independently unsubstituted or substituted $C_1$-$C_{20}$ alkyl, or unsubstituted or substituted $C_6$-$C_{30}$ aryl, wherein $R^{34}$ is identical to or different from each other when m is an integer of two or more and each $R^{35}$ is identical to or different from each other when n is an integer of two or more; and each of m and n is independently an integer of 0 to 5.

In an aspect, in Formula 1, each of $R^1$ and $R^2$ is independently an unsubstituted carbazolyl. In another embodiment, in Formula 1, Z is N or $CR^4$, wherein $R^4$ is hydrogen or unsubstituted or substituted $C_1$-$C_4$ alkyl. In yet another embodiment, in Formula 1, each of $L^1$ and $L^2$ is independently a single bond, unsubstituted carbazolyl or an unsubstituted or substituted phenyl.

In an aspect, in Formula 3, each of $R^{11}$ to $R^{14}$ is independently hydrogen, unsubstituted or substituted $C_1$-$C_4$ alkyl, unsubstituted or substituted phenyl, or unsubstituted or substituted adamantyl.

In an aspect, in Formula 5, each of $R_{21}$ and $R_{22}$ is independently hydrogen, or an unsubstituted or substituted $C_1$-$C_4$ alkyl. In another aspect, in Formula 5, each of $R^{23}$ and $R^{24}$ is independently unsubstituted or substituted naphthalene.

In an aspect, in Formula 7, each of $R^{31}$ and $R^{32}$ is independently hydrogen, or an unsubstituted or substituted $C_1$-$C_8$ alkyl. In another aspect, in Formula 7, each of $R^{31}$ and $R^{32}$ is t-butyl. In another aspect, in Formula 7, $R^{33}$ is a bis(4-(tert-butyl)phenyl)amine. In another aspect, in Formula 7, each of $R^{34}$ and $R^{35}$ is independently unsubstituted or substituted $C_1$-$C_8$ alkyl. In an aspect, in Formula 7, each of $R^{34}$ and $R^{35}$ is tert-butyl. In an aspect, in Formula 7, each of $R^{34}$ and $R^{35}$ is unsubstituted phenyl.

As an example, the first emitting material layer can be disposed between the second emitting material layer and the second electrode.

The first compound can have an excited triplet energy level higher than an excited triplet energy level of the second compound, and/or the fourth compound can have an excited triplet energy level higher than an excited triplet energy level of the third compound.

Alternatively, the third compound can have an excited singlet energy level higher than an excited singlet energy level of the fourth compound and/or the fourth compound can have an excited singlet energy level higher than an excited triplet energy level of the third compound.

The second compound can have a ratio of an intensity of a second emission peak of to an intensity of a maximum emission peak between about 0.20 and about 0.65.

The fourth compound has a full-width at quarter maximum (FWQM) narrower than a full-width at quarter maximum of the second compound.

Alternatively, the emissive layer can comprise a first emitting part disposed between the first and second electrodes, a second emitting part disposed between the first emitting part and the second electrode and a first charge generation layer disposed between the first and second emitting parts, wherein at least one of the first emitting part and the second emitting part comprises the emitting material layer.

For example, the first emitting part can comprise the emitting material layer and/or the second emitting part can comprise a blue fluorescent emitting material layer, a blue phosphorescent emitting material layer, a blue delayed fluorescent emitting material layer or the emitting material layer.

Alternatively, the emissive layer can further comprise a third emitting part disposed between the second emitting part and the second electrode and a second charge generation layer disposed between the second and third emitting parts.

In this case, at least one of the first emitting part and the third emitting part can comprise the emitting material layer.

In another aspect, an organic light emitting device, such as an organic light emitting display device or an organic light emitting luminescent device comprises a substrate and the OLED disposed over the substrate, as described above. For instance, an organic light emitting display device can comprise a substrate and an OLED display panel comprising an array of pixels on the substrate, wherein each pixel comprises one or more individually addressable organic light emitting diodes described above.

A part of the triplet exciton energy generated in the first emitting material layer comprising a phosphorescent material of excellent luminous efficiency induces phosphorescent emission and a rest of the triplet exciton is transferred to the adjacently disposed second emitting material implementing triplet-triplet annihilation by Dexter mechanism. The triplet exciton energy transferred to the second emitting material layer is transferred from the third compound to the singlet exciton of the fourth compound through triplet-triplet-annihilation, and then, the fourth compound implement fluorescent emission ultimately.

As the high energy triplet exciton generated in the phosphorescent material is distributed to the fluorescent emitting material layer, the concentration of the triplet exciton in the phosphorescent emitting material layer is reduced, and therefore, the driving stability of the OLED can be improved. The fluorescent material emits deed blue light and has excellent color purity and luminous lifespan. Accordingly, it is possible to implement an OLED and an organic light emitting device that can optimize color purity and luminous lifespan with emitting deed blue color by including the emitting material layer.

It is to be understood that both the foregoing general description and the following detailed description are exemplary and explanatory and are intended to provide further explanation of the inventive concepts as claimed.

BRIEF DESCRIPTION OF THE DRAWING

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION OF THE EMBODIMENTS

Reference and discussions will now be made below in detail to aspects, embodiments and examples of the disclosure, some examples of which are illustrated in the accompanying drawings.

The present disclosure relates to an organic light emitting diode (OLED) into which a first compound and a second compound having adjusted energy levels are applied in an identical EML or adjacently disposed EMLs and an organic light emitting device having the OLED. The OLED can be applied into an organic light emitting device such as an organic light emitting display device and an organic light emitting luminescent device. As an example, a display device applying the OLED will be described.

Figure 1:
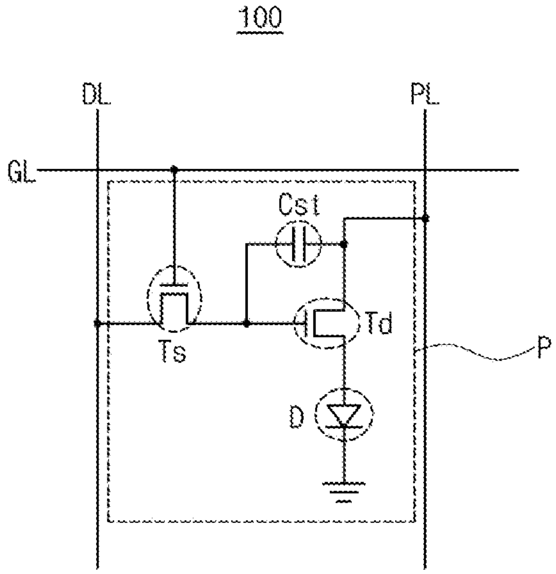
FIG. 1 is a schematic circuit diagram of an organic light emitting display device in accordance with the preset disclosure.
Figure 7:
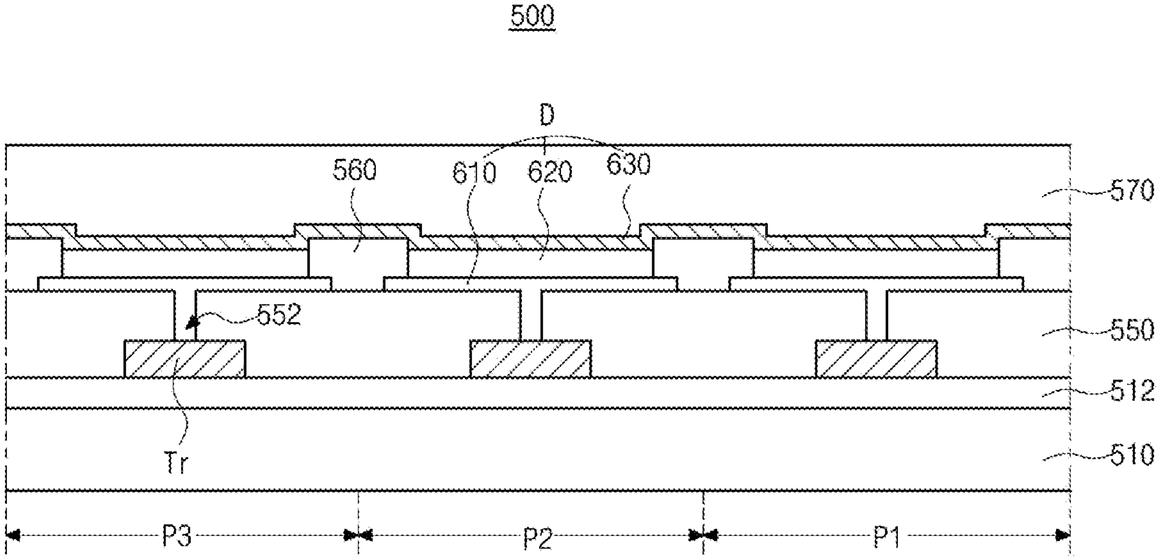
FIG. 7 is a schematic cross-sectional view illustrating an organic light emitting display device in accordance with another aspect of the present disclosure.

FIG. 1 is a schematic circuit diagram of an organic light emitting display device in accordance with the present disclosure. As illustrated in FIG. 1, a gate line GL, a data line DL and power line PL, each of which cross each other to define a pixel region P, in an organic light emitting display device 100. A switching thin film transistor Ts, a driving thin film transistor Td, a storage capacitor Cst and an organic light emitting diode D are formed within the pixel region P. The pixel region P can include a first pixel region P1, a second pixel region P2 and a third pixel region P3 (FIG. 7).

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that currents proportional to the data signal are supplied from the power line PL to the organic light emitting diode D through the driving thin film transistor Td. And then, the organic light emitting diode D emits light with a luminance proportional to the currents flowing through the driving thin film transistor Td. In this case, the storage capacitor Cst is charged with voltages proportional to the data signal so that the voltage of the gate electrode in the driving thin film transistor Td is kept constant during one frame. Therefore, the organic light emitting display device 100 can display a desired image.

Figure 2:
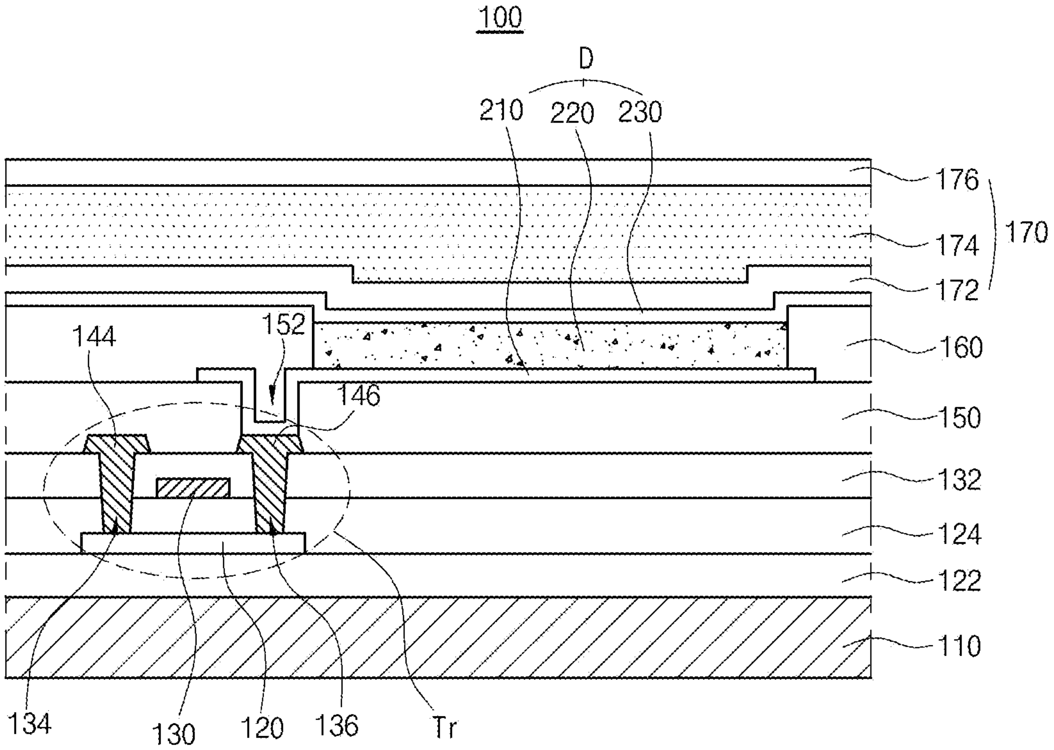
FIG. 2 is a schematic cross-sectional view illustrating an organic light emitting display device in accordance with an aspect of the present disclosure.

FIG. 2 is a schematic cross-sectional view of an organic light emitting display device 100 in accordance with an aspect of the present disclosure. All components of the organic light emitting device in accordance with all aspects of the present disclosure are operatively coupled and configured. As illustrated in FIG. 2, the organic light emitting display device 100 includes a substrate 110, a thin-film transistor Tr on the substrate 110, and an organic light emitting diode (OLED) D over the substrate 110 and connected to the thin film transistor Tr.

The substrate 110 can include, but is not limited to, glass, thin flexible material and/or polymer plastics. For example, the flexible material can include, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 can be disposed over the substrate 110, and the thin film transistor Tr is disposed over the buffer layer 122. The buffer layer 122 can be omitted.

A semiconductor layer 120 is disposed over the buffer layer 122, or the Tr layer (if the buffer layer 122 is omitted). In one aspect, the semiconductor layer 120 can include, but is not limited to, oxide semiconductor materials. In this case, a light-shield pattern can be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 can include, but is not limited to, polycrystalline silicon. In this case, opposite edges of the semiconductor layer 120 can be doped with impurities.

A gate insulating layer 124 made of an insulating material is disposed on the semiconductor layer 120. The gate insulating layer 124 can include, but is not limited to, an inorganic insulating material such as silicon oxide ($SiO_x$) or silicon nitride ($SiN_x$).

A gate electrode 130 made of a conductive material such as metal is disposed over the gate insulating layer 124 so as to correspond to a center of the semiconductor layer 120. While the gate insulating layer 124 is disposed over a whole area of the substrate 110 in FIG. 2, the gate insulating layer 124 can be patterned identically as the gate electrode 130.

An interlayer insulating layer 132 made of an insulating material is disposed on the gate electrode 130 with covering over an entire surface of the substrate 110. The interlayer insulating layer 132 can include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 2. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are made of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 2 has a coplanar structure in which the gate electrode 130, the source electrode 144 and the drain electrode 146 are disposed over the semiconductor layer 120. Alternatively, the thin film transistor Tr can have an inverted staggered structure in which a gate electrode is disposed under a semiconductor layer and a source and drain electrodes are disposed over the semiconductor layer. In this case, the semiconductor layer can include amorphous silicon.

The gate line GL and the data line DL, which cross each other to define the pixel region P, and the switching element Ts, which is connected to the gate line GL and the data line DL, can be further formed in the pixel region P of FIG. 1. The switching element Ts is connected to the thin film transistor Tr, which is a driving element. Besides, the power line PL is spaced apart in parallel from the gate line GL or the data line DL, and the thin film transistor Tr can further include a storage capacitor Cst configured to constantly keep voltage of the gate electrode 130 for one frame.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it can be spaced apart from the second semiconductor layer contact hole 136.

The OLED D includes a first electrode 210, for example, disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 can be an anode and include a conductive material having a relatively high work function value. For example, the first electrode 210 can include a transparent conductive oxide (TCO).

In one aspect, when the organic light emitting display device 100 is a bottom-emission type, the first electrode 210 can have a single-layered structure of a transparent conductive material. Alternatively, when the organic light emitting display device 100 is a top-emission type, a reflective electrode or a reflective layer can be disposed under the first electrode 210.

For example, the reflective electrode or the reflective layer can include, but is not limited to, silver (Ag) or aluminum-palladium-copper (APC) alloy. In the OLED D of the top-emission type, the first electrode 210 can have a triple-layered structure of ITO/Ag/ITO or ITO/APC/ITO. In addition, a bank layer 160 is disposed on the passivation layer 150 in order to cover edges of the first electrode 210. The bank layer 160 exposes a center of the first electrode 210 corresponding to the pixel region P.

Figure 3:
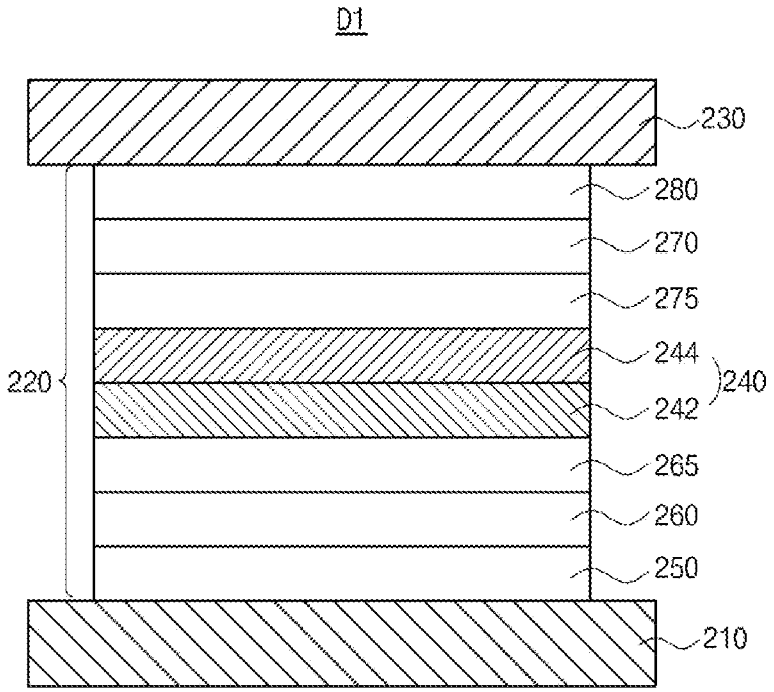
FIG. 3 is a schematic cross-sectional view illustrating an organic light emitting diode (OLED) in accordance with an aspect of the present disclosure.
Figure 6:
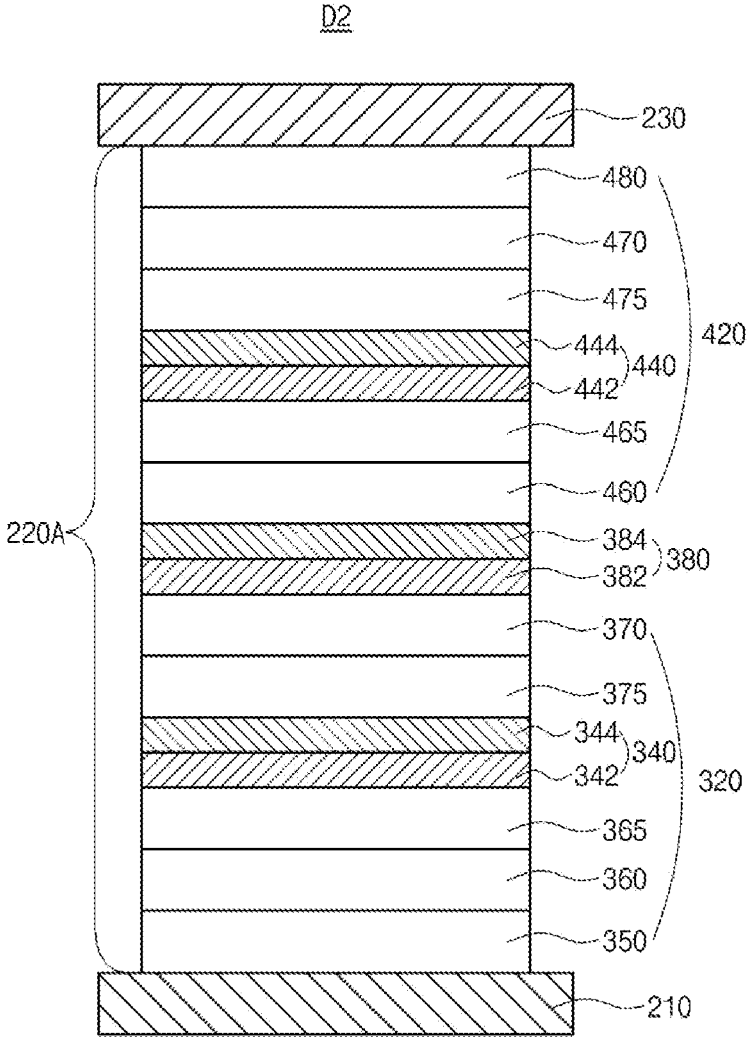
FIG. 6 is a schematic cross-sectional view illustrating an OLED in accordance with another aspect of the present disclosure.

The emissive layer 220 is disposed on the first electrode 210. In one aspect, the emissive layer 220 can have a single-layered structure of an emitting material layer (EML). Alternatively, the emissive layer 220 can have a multiple-layered structure of a hole injection layer (HIL), a hole transport layer (HTL), an electron blocking layer (EBL), an EML, a hole blocking layer (HBL), an electron transport layer (ETL) and/or an electron injection layer (EML) (FIGS. 3 and 6). In one aspect, the emissive layer 220 can have single emitting part. Alternatively, the emissive layer 220 can have multiple emitting parts to form a tandem structure.

The second electrode 230 is disposed over the substrate 110 above which the emissive layer 220 is disposed. The second electrode 230 can be disposed over a whole display area and can include a conductive material with a relatively low work function value compared to the first electrode 210. The second electrode 230 can be a cathode. When the organic light emitting display device 100 is a top-emission type, the second electrode 230 is thin so as to have light-transmissive (semi-transmissive) property.

In addition, an encapsulation film 170 can be disposed over the second electrode 230 in order to prevent outer moisture from penetrating into the OLED D. The encapsulation film 170 can have, but is not limited to, a laminated structure of a first inorganic insulating film 172, an organic insulating film 174 and a second inorganic insulating film 176.

Moreover, the organic light emitting display device 100 can have a polarizer in order to decrease external light reflection. For example, the polarizer can be a circular polarizer. When the organic light emitting display device 100 is a bottom-emission type, the polarizer can be disposed under the substrate 110. Alternatively, when the organic light emitting display device 100 is a top-emission type, the polarizer can be disposed over the encapsulation film 170. In addition, a cover window can be attached to the encapsulation film 170 or the polarizer. In this case, the substrate 110 and the cover window can have a flexible property, thus the organic light emitting display device 100 can be a flexible display device.

Now, we will describe the OLED in more detail. FIG. 3 is a schematic cross-sectional view illustrating an OLED in accordance with an aspect of the present disclosure. As illustrated in FIG. 3, the OLED D1 comprises first and second electrodes 210 and 230 facing each other, and an emissive layer 220 having single emitting part disposed between the first and second electrodes 210 and 230. The organic light emitting display device 100 includes a red pixel region, a green pixel region and a blue pixel region, and the OLED D1 can be disposed in the blue pixel region.

The emissive layer 220 includes an EML 240 disposed between the first and second electrodes 210 and 230. Also, the emissive layer 220 can include at least one of an HTL 260 disposed between the first electrode 210 and the EML 240 and an ETL 270 disposed between the second electrode 230 and the EML 240. In addition, the emissive layer 220 can further include at least one of an HIL 250 disposed between the first electrode 210 and the HTL 260 and an EML 280 disposed between the second electrode 230 and the ETL 270. Alternatively, the emissive layer 220 can further include an EBL 265 265 disposed between the HTL 260 and the EML 240 and/or an HBL 275 disposed between the EML 240 and the ETL 270.

The first electrode 210 can be an anode that provides holes into the EML 240. The first electrode 210 can include, but is not limited to, a conductive material having a relatively high work function value, for example, a transparent conductive oxide (TCO). More particularly, the first electrode 210 can include, but is not limited to, indium tin oxide (ITO), indium zinc oxide (IZO), indium tin zinc oxide (ITZO), tin oxide (SnO), zinc oxide (ZnO), cerium doped indium oxide (ICO), aluminum doped zinc oxide (Al: ZnO, AZO), and the like.

The second electrode 230 can be a cathode that provides electrons into the EML 240. The second electrode 230 can include, but is not limited to, a conductive material having a relatively low work function values, i.e., a highly reflective material such as For example, the second electrode 230 can include, but is not limited to, aluminum (Al), magnesium (Mg), calcium (Ca), silver (Ag), alloy thereof or combination thereof such as aluminum-magnesium alloy (Al—Mg), and the like.

The EML 240 includes a first EML (EML1) 242 disposed between the EBL 265 and the HBL 275 and a second EML (EML2) 244 disposed adjacently to the EML1 242. The EML1 242 implements phosphorescent emission and the EML2 244 implements triplet-triplet-annihilation (TTA).

When holes and electrons meet each other to form excitons in the EML 240, singlet exciton with a paired spin state and triplet exciton with an unpaired spin state are generated in a ratio of 1:3 by spin arrangement. Since the conventional fluorescent materials can utilize only the singlet excitons, they exhibit low luminous efficiency. The phosphorescent materials can utilize the triplet excitons as well as the singlet excitons, while they show too short luminous lifespan to be applicable to commercial devices. In accordance with the present disclosure, it is possible to realize deep blue emission with improved color purity and luminous lifespan by introducing the EML1 242 implementing phosphorescent emission and the EML2 244 implementing TTA.

As an example, when the organic light emitting display device 100 (FIG. 2) is the top-emission type, any EML including luminous materials which has maximum emission peak (PL peak) in the relatively shorter wavelength ranges among the luminous materials in the EML1 and EML2 242 and 244 can be disposed adjacently to the second electrode 230 acting as cathode. In this case, cavity effect is maximized, and the luminous efficiency of the OLED D1 can be maximized. In one aspect, the EML2 244 including the fluorescent material can be disposed between the EML1 242 and the HBL 275, but is not limited thereto.

The EML1 242 includes the first compound (Compound 1) of the first host and the second compound (Compound 2) of the phosphorescent material. The EML2 244 includes the third compound (Compound 3) of the second host and the fourth compound (Compound 4) of the fluorescent material. The first compound can be phosphorescent host and can have the following structure of Formula 1:

[Formula 1]

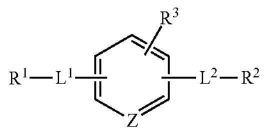

wherein, in Formula 1, each of $R^1$ and $R^2$ is independently an unsubstituted or substituted carbazolyl or an unsubstituted or substituted carboline;

$R^3$ is hydrogen, cyano, unsubstituted or substituted $C_1$-$C_{20}$ alkyl, unsubstituted or substituted $C_6$-$C_{30}$ aryl or unsubstituted or substituted $C_3$-$C_{30}$ hetero aryl;

Z is N or $CR_4$, wherein $R^4$ is hydrogen, unsubstituted or substituted $C_1$-$C_{10}$ alkyl, unsubstituted or substituted $C_6$-$C_{30}$ aryl or unsubstituted or substituted $C_3$-$C_{30}$ hetero aryl; and each of $L^1$ and $L^2$ is independently a single bond, unsubstituted or substituted $C_6$-$C_{30}$ arylene or unsubstituted or substituted $C_3$-$C_{30}$ hetero arylene.

As an example, each of the carbazolyl and the carboline of $R^1$ and $R^2$, the $C_6$-$C_{30}$ aryl and the $C_3$-$C_{30}$ hetero aryl of $R^3$, and the $C_6$-$C_{30}$ aryl and the $C_3$-$C_{30}$ hetero arylene of $L^1$ and $L^2$ can be independently unsubstituted or substituted with at least one of cyano, $C_6$-$C_{30}$ aryl such as $C_6$-$C_{20}$ aryl and $C_3$-$C_{30}$ hetero aryl such as $C_3$-$C_{20}$ hetero aryl.

As used herein, the term "unsubstituted" indicates that a hydrogen atom is bonded, and, in this case, the hydrogen atom includes protium, deuterium and tritium.

As used herein, substituent in the term "substituted" includes, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "hetero" in such as "a hetero aromatic group", "hetero aryl", "hetero aryl alkyl", "hetero aryl oxy", "hetero aryl amino" and "hetero arylene group" means that at least one carbon atom, for example 1-5 carbons atoms, constituting an aromatic group or ring is substituted with at least one hetero atom selected from the group consisting of N, O, S, P and combination thereof.

As used herein, the $C_6$-$C_{30}$ aryl can include, but is not limited to, a non-fused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

As used herein, the $C_3$-$C_{30}$ hetero aryl can include independently, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carboline, quinolinyl, iso-quinolinyl, phthalazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxanyl, benzo-furanyl, dibenzo-furanyl, thiopyranyl, xanthenyl, chromenyl, iso-chromenyl, thiazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, N-substituted spiro-fluorenyl, spiro-fluoreno-acridinyl and spiro-fluoreno-xanthenyl.

As an example, $R_3$ in Formula 1 can be, but is not limited to, hydrogen, cyano, $C_1$-$C_5$ alkyl or phenyl unsubstituted or substituted with at least one of cyano, phenyl and carbazolyl, and each of $L_1$ and $L_2$ can be, but is not limited to, phenylene unsubstituted or substituted with at least one of $C_1$-$C_5$ alkyl, cyano, phenyl ant carbazolyl.

For example, the first compound H1 included in the EML1 242 can be selected from, but is not limited to, the organic compounds having the following structure of Formula 2:

[Formula 2]

1-1

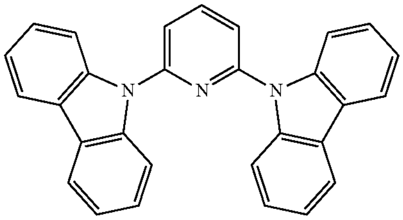

1-2

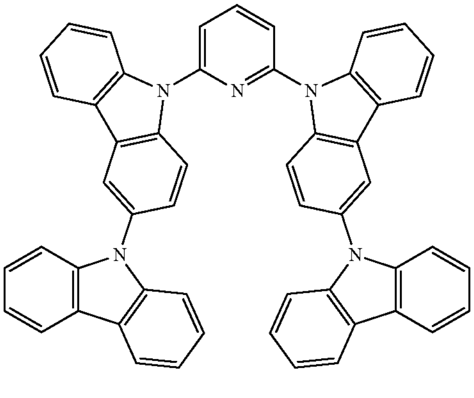

-continued 1-3

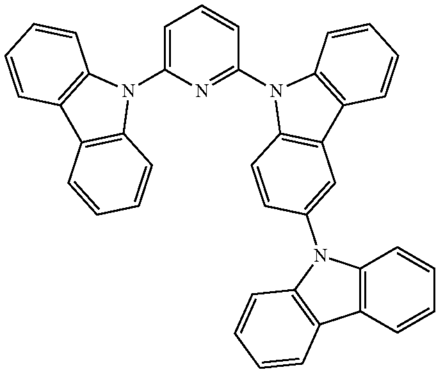

1-4

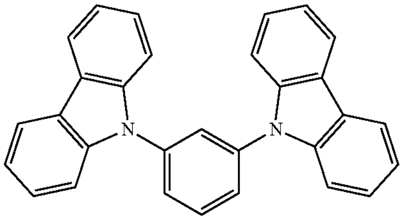

1-5

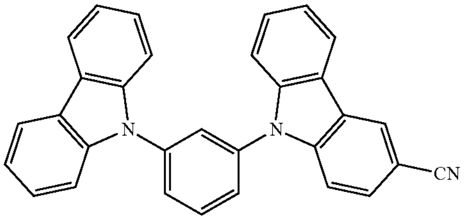

1-6

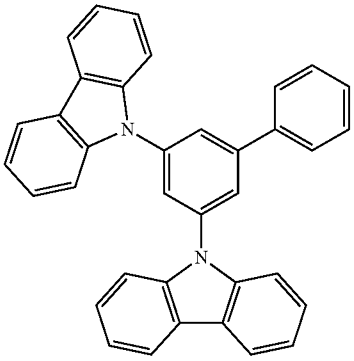

1-7

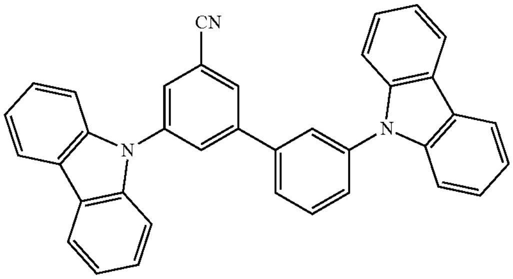

-continued 1-8

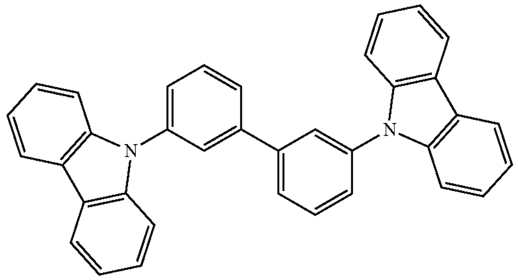

1-9

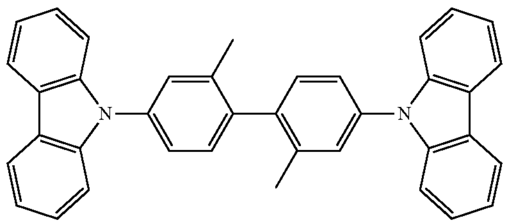

1-10

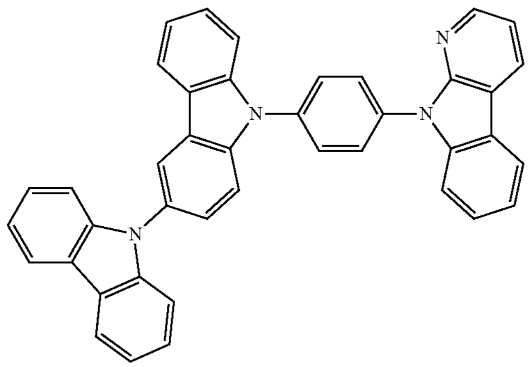

1-11

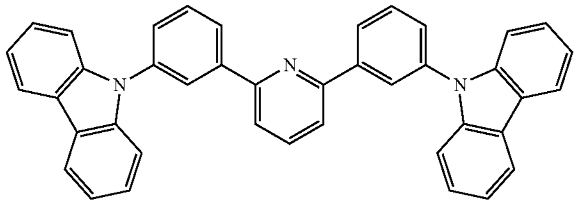

1-12

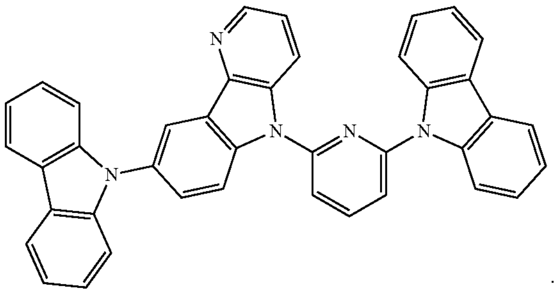

.

The second compound is phosphorescent material which can emit triplet excitons by Inter System Crossing (ISC). The second compound can be platinum-based complex having tetradentate ligands, and can have the following structure of Formula 3:

[Formula 3]

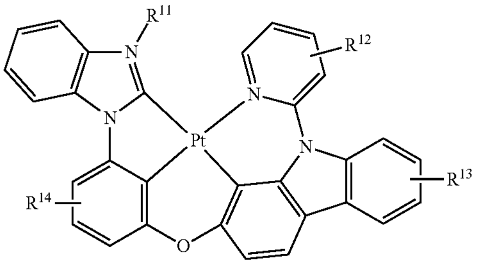

wherein, in Formula 3, each of $R^{11}$ to $R^{14}$ is independently hydrogen, halogen, cyano, unsubstituted or substituted $C_1$-$C_{10}$ alkyl, unsubstituted or substituted $C_1$-$C_{10}$ alkyl amino, unsubstituted or substituted $C_6$-$C_{30}$ aryl, unsubstituted or substituted $C_3$-$C_{30}$ hetero aryl or unsubstituted or substituted adamantyl.

As an example, each of the $C_6$-$C_{30}$ aryl, the $C_3$-$C_{30}$ hetero aryl and the adamantyl of $R^{11}$ to $R^{14}$ can be independently unsubstituted or substituted with at least one of $C_1$-$C_{10}$ alkyl, $C_6$-$C_{30}$ aryl (e.g., $C_6$-$C_{20}$ aryl) and $C_3$-$C_{30}$ hetero aryl (e.g., $C_3$-$C_{20}$ aryl).

For example, $R^{11}$ in Formula 3 can be hydrogen, unsubstituted or substituted $C_1$-$C_5$ alkyl, unsubstituted or substituted phenyl or unsubstituted or substituted adamantyl, $R^{12}$ in Formula 3 can be hydrogen, unsubstituted or substituted $C_1$-$C_5$ alkyl, unsubstituted or substituted (e.g. phenyl) adamantyl, $R^{13}$ in Formula 3 can be hydrogen, unsubstituted or substituted $C_1$-$C_5$ alkyl, unsubstituted or substituted (e.g. at least one phenyl) carbazolyl or unsubstituted or substituted (e.g. at least one phenyl) phenyl, and $R^{14}$ in Formula 3 can be hydrogen or unsubstituted or substituted $C_1$-$C_5$ alkyl, but is not limited thereto.

As an example, the second compound included in the EML1 242 can be selected from, but is not limited to, the organic compounds having the following structure of Formula 4:

[Formula 4]

2-1

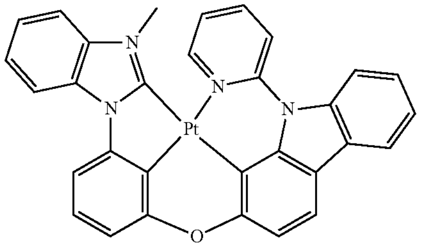

2-2

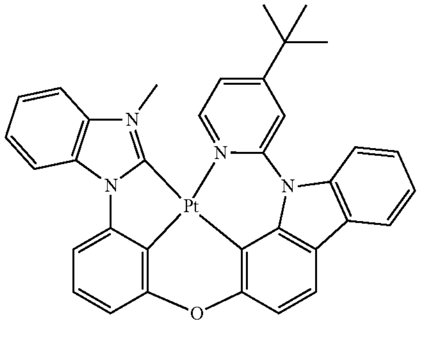

-continued
2-3
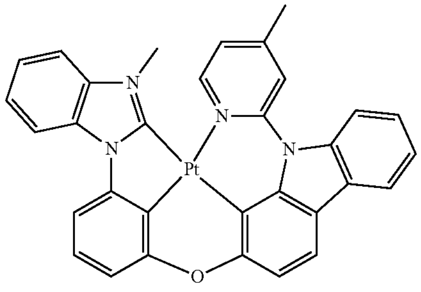
2-4
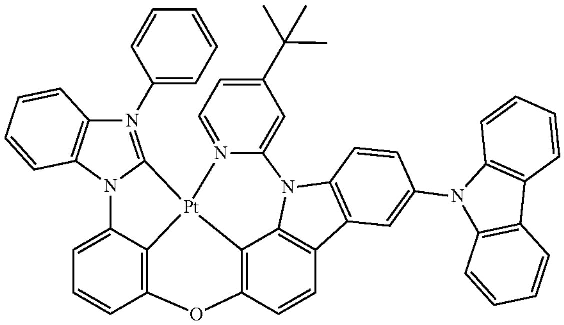
2-5
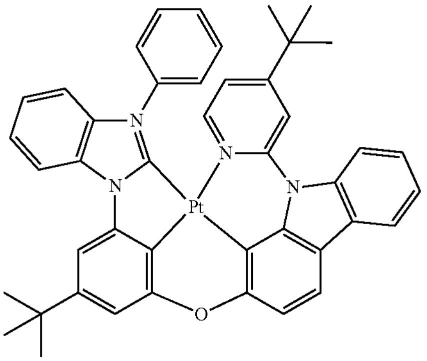
2-6
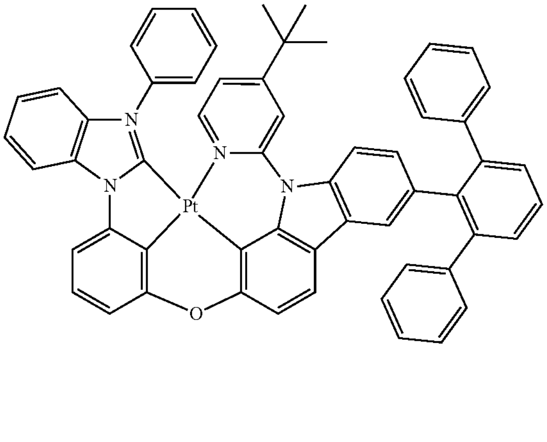
-continued
2-7
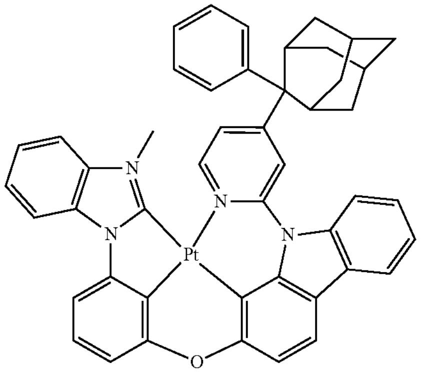
2-8
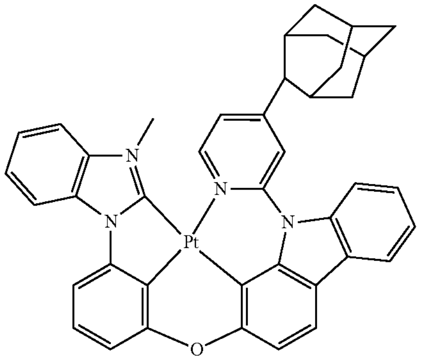
2-9
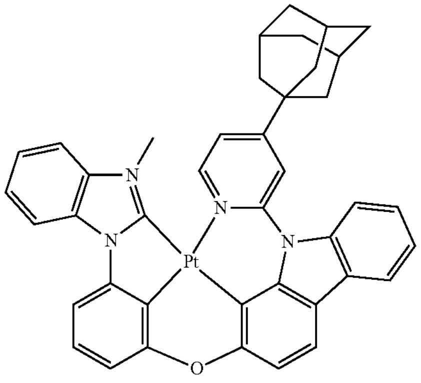
2-10
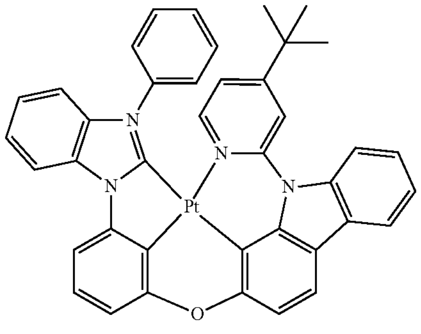

-continued 2-11

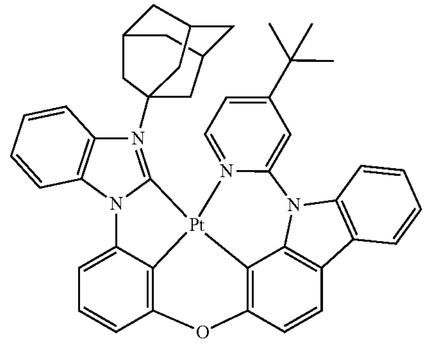

2-12

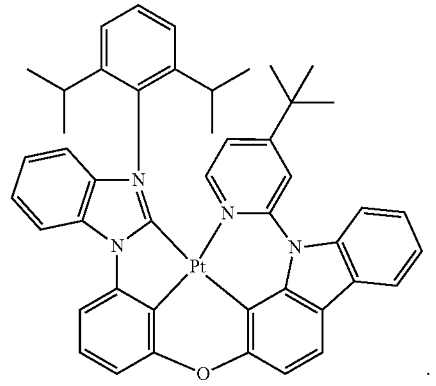

While the second compound having the structure of Formula 3 has excellent luminous efficiency, but it is difficult to implement deep blue and has short luminous lifespan. However, in this aspect, the excitons generated in the second compound are distributed both in the EML1 242, which includes the second compound of the phosphorescent material and emits phosphorescence by ISC, and in the EML2 244, which includes the fourth compound of emitting fluorescence. The phosphorescence emission and the fluorescence emission are admixed, the color purity of the EML 240 can be improved and the luminous lifespan of the EML 240 can be enhanced by lowering the concentration of triplet excitons in the EML1 242.

More particularly, the EML 240 includes the EML2 244 disposed adjacently to the EML1 242 and implementing TTA. TTA is a phenomenon in which a singlet state is formed by interaction or collision of molecules excited into a triplet state, and occurs when the density of triplet excitons is high.

In an OLED using fluorescent material, if triplet excitons are additionally utilized, 15% of 75% of triplet excitons are regenerated as singlet intermediates. In this case, total 40% of the singlet excitons can be formed if 25% of the initially generated singlet excitons are included. Therefore, an external quantum efficiency of 8-12% by the light coupling efficiency using the TTA mechanism. Particularly, in a molecule satisfying the relationship of the sum of two triplet exciton energies is greater than the singlet exciton energy ($2T_1>S_1$), one singlet exciton can be generated by collision of two triplet excitons probabilistically. In this case, 37.5%, which is half of the initially generated triplet excitons, can be regenerated into singlet excitons upward transfer, it is possible to generate maximum 62.5% of singlet excitons, and maximum 12.5%-18.8% of external quantum efficiency can be realized.

In the TTA process, since two triplet excitons collide to generate up to one singlet exciton, the luminous efficiency utilizing the TTA process can be improved compared to the case of simply utilizing fluorescence. In addition, constant luminous efficiency can be realized regardless of the current density in applying the TTA process into the OLED D.

The EML2 244 includes the third compound of the second host and the fourth compound of the fluorescent material. The third compound can act as an electron acceptor having a molecular structure of implementing TTA mechanism and the fourth compound of the fluorescent material can act as a photon sensitizer. The third compound can include an anthracene-based organic compound having the following structure of Formula 5:

[Formula 5]

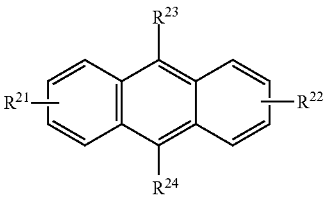

wherein, in Formula 5, each of $R_{21}$ and $R_{22}$ is independently hydrogen, unsubstituted or substituted $C_1$-$C_{20}$ alkyl, unsubstituted or substituted $C_6$-$C_{30}$ aryl or unsubstituted or substituted $C_3$-$C_{30}$ hetero aryl; and each of $R^{23}$ and $R^{24}$ is independently an unsubstituted or substituted $C_6$-$C_{30}$ aryl or unsubstituted or substituted $C_3$-$C_{30}$ hetero aryl.

As an example, each of the $C_6$-$C_{30}$ aryl and the $C_3$-$C_{30}$ hetero aryl of $R^{21}$ to $R^{24}$ can be independently unsubstituted or substituted with at least one of $C_6$-$C_{30}$ aryl and $C_3$-$C_{30}$ hetero aryl. For example, each of $R^{21}$ and $R^{22}$ can be independently hydrogen, unsubstituted or substituted C1-C5 alkyl or unsubstituted or substituted phenyl, and each of $R^{23}$ and $R^{24}$ can be independently unsubstituted or naphthyl (e.g., 1-naphthyl or 2-naphthyl) substituted phenyl or unsubstituted or substituted naphthyl (e.g., 1-naphthyl or 2-naphthyl, but is not limited thereto.

The anthracene-based organic compound having the structure of Formula 5 has excellent quantum efficiency, stable electrochemical properties and proper excited triplet energy level, and thus, it is appropriate for blue emission. For example, the third compound of the second host that can implement TTA property can be selected from, but is not limited to, anthracene-based organic compounds having the following structure of Formula 6:

[Formula 6]
3-1
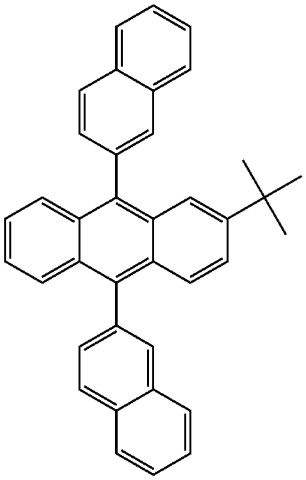
3-2
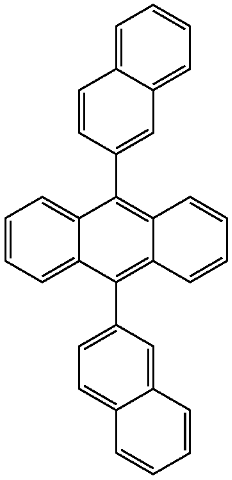
3-3
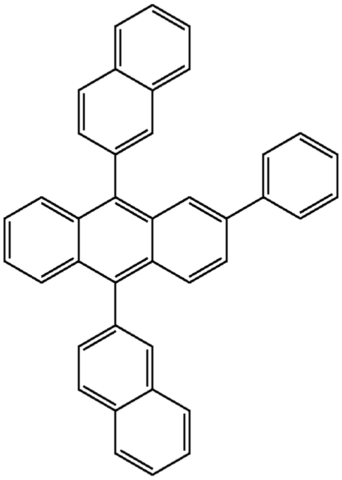
-continued
3-4
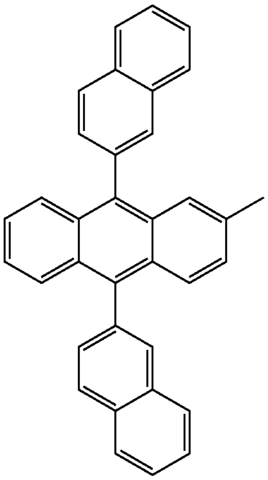
3-5
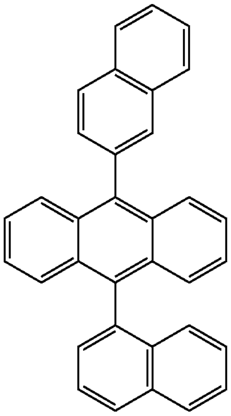
3-6
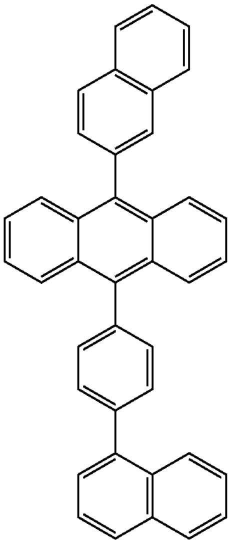

-continued 3-7

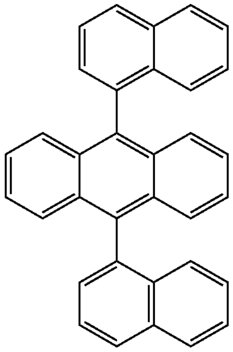

3-8

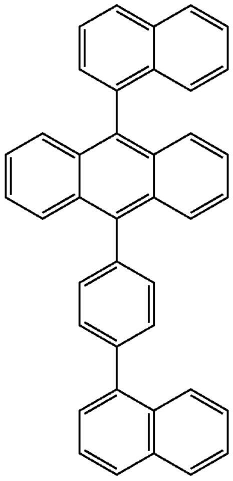

3-9

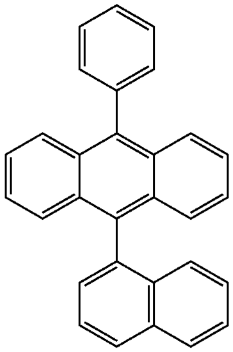

-continued 3-10

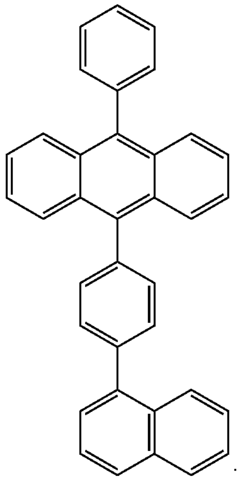

The fourth compound included in the EML2 244 can be fluorescent material having maximum emission peak similar to the maximum emission peak of the second compound. As an example, the fourth compound can be fluorescent material in which excitons are transferred to the ground state from the excited state and which has narrower FWQM (Full-width at Quarter Maximum) than the FWQM of the second compound, and therefore, has very excellent color purity. For example, the fourth compound can be boron-based organic compound having the following structure of Formula 7:

[Formula 7]

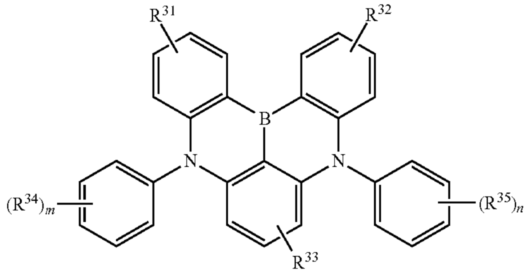

wherein, in Formula 7, each of $R^{31}$ to $R^{33}$ is independently hydrogen, halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino;

each of $R^{34}$ and $R^{35}$ is independently halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino, wherein $R^{34}$ is identical to or different from each other when m is an integer of two or more and each $R^{35}$ is identical to or different from each other when n is an integer of two or more; and each of m and n is independently an integer of 0 to 5.

As an example, each of the $C_6$-$C_{30}$ aryl, the $C_3$-$C_{30}$ hetero aryl, the $C_6$-$C_{30}$ aryl amino of $R^{31}$ to $R^{35}$ can be independently unsubstituted or substituted with at least one of $C_1$-$C_{20}$ alkyl, $C_6$-$C_{30}$ aryl and $C_3$-$C_{30}$ hetero aryl. For example, each of $R^{31}$ and $R^{32}$ can be independently hydrogen or unsubstituted or substituted $C_1$-$C_{10}$ alkyl (e.g., $C_1$-$C_5$ alkyl), $R^{33}$ can be hydrogen or biphenyl amino unsubstituted or substituted with $C_1$-$C_{10}$ alkyl (e.g., $C_1$-$C_5$ alkyl), and each of $R^{34}$ and $R^{35}$ can be independently hydrogen, unsubstituted or substituted $C_1$-$C_{10}$ alkyl (e.g., $C_1$-$C_5$ alkyl) or unsubstituted or at least one phenyl-substituted phenyl, but is not limited thereto. As an example, the fourth compound can be selected from, but is not limited to, the boron-based organic compounds having the following structure of Formula 8:

[Formula 8]

4-1

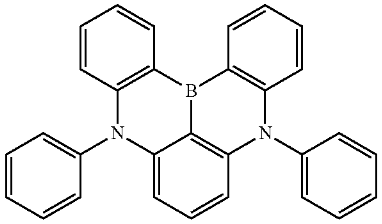

4-2

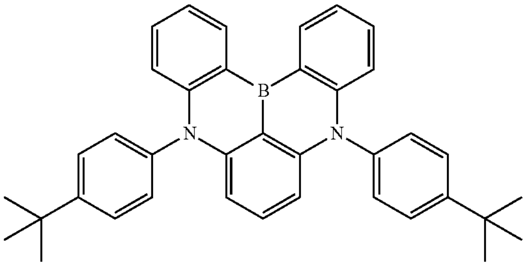

4-3

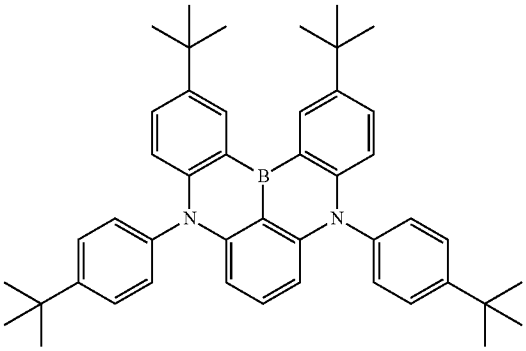

4-4

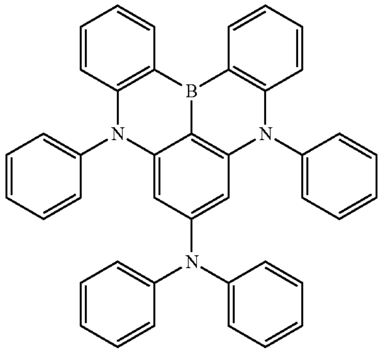

-continued 4-5

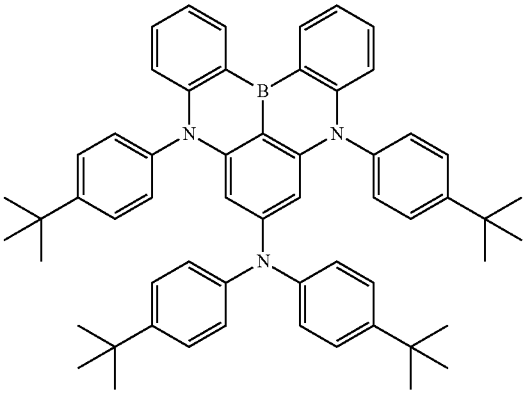

4-6

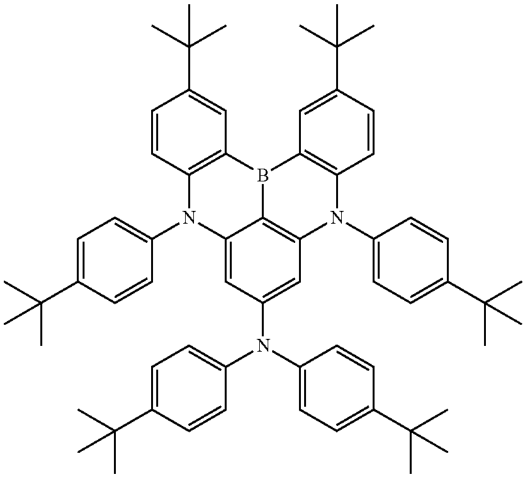

4-7

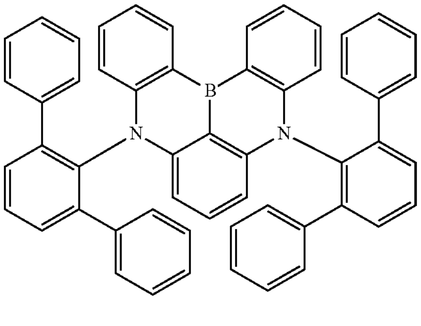

4-8

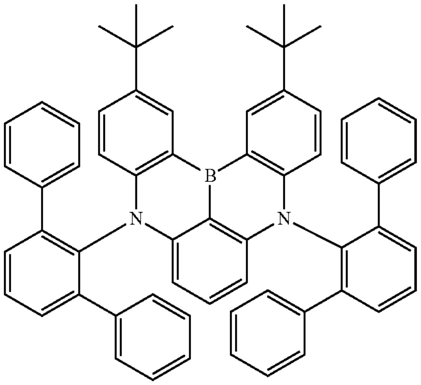

-continued 4-9

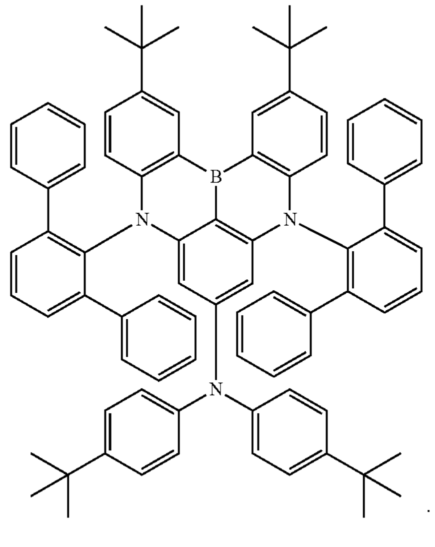

In one aspect, the contents of the second compound in the EML1 242 can be larger than the contents of the fourth compound in the EML2 244. In this case, the triplet exciton energies generated in the second compound can be transferred ultimately to the fourth compound via the third compound. As an example, the contents of the second compound in the EML1 242 can be between about 5 to about 20 wt. %, for example, about 5 to about 15 wt. %, and the contents of the fourth compound in the EML2 244 can be between about 0.1 to about 5 wt. %, for example, about 0.5 to about 3 wt. %, but is not limited thereto.

Figure 4:
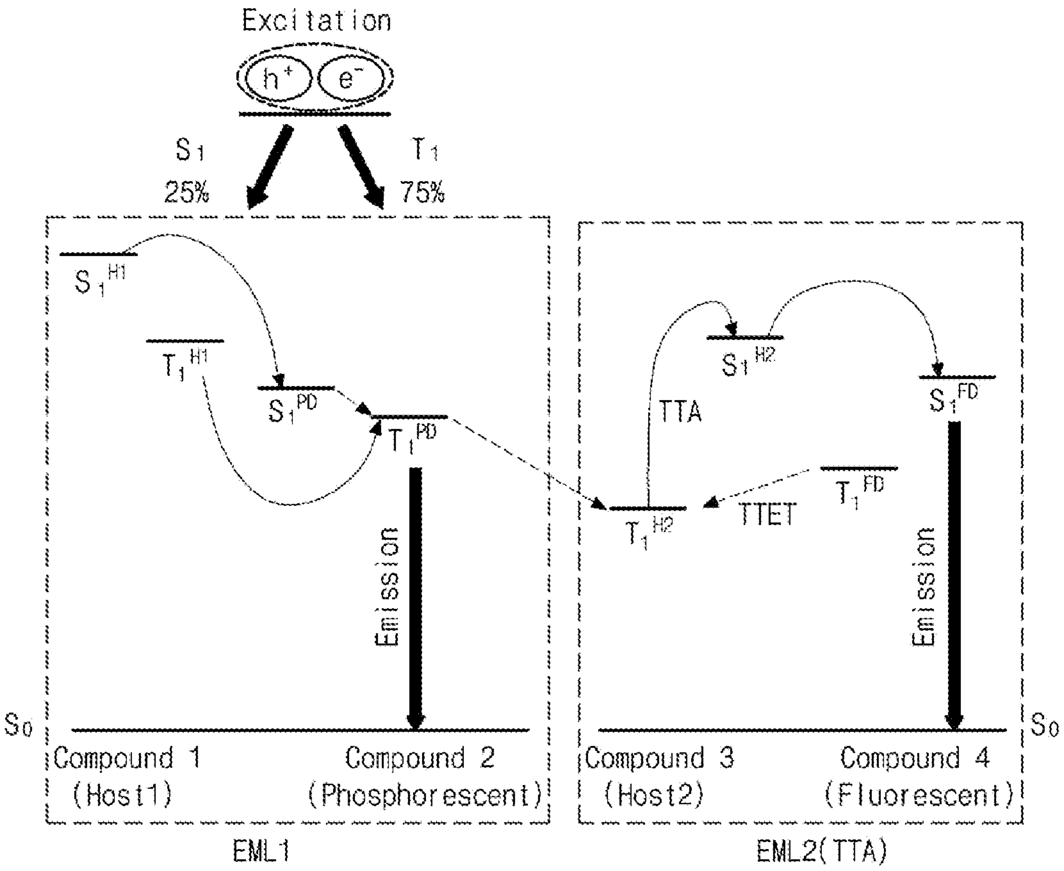
FIG. 4 is a schematic diagram illustrating luminous mechanism by singlet and triplet energy levels among luminous material in an EML in accordance with an aspect of the present disclosure.

Now, we will describe the luminous mechanism in the EML 240. FIG. 4 is a schematic diagram illustrating luminous mechanism by singlet and triplet energy levels among luminous materials in an EML in accordance with one aspect of the present disclosure. The first compound in the EML1 242 implementing the phosphorescent emission should induce the triplet excitons in the second compound of the phosphorescent material to be involved in the light emission without quenching as a non-emissive extinction.

As illustrated schematically in FIG. 4, each of an excited triplet energy level $T_1H^1$ and an excited singlet energy level $S_1H^1$ of the first compound included in the EML1 242 is higher than an excited triplet energy level $T_1^{PD}$ and an excited singlet energy level $S_1^{PD}$ of the second compound, respectively. As an example, each of the triplet energy level $T_1^{H1}$ and the excited singlet energy level $S_1^{H1}$ of the third compound can be higher than the triplet energy level $T_1^{PD}$ and the singlet energy level $S_1^{PD}$ of the second compound by at least about 0.2 eV, for example, at least about 0.3 eV such as at least about 0.5 eV.

For example, when the triplet energy level $T_1^{H1}$ of the first compound is not high enough than the triplet energy level $T_1^{PD}$ of the second compound, the excitons at the triplet energy level $T_1^{PD}$ of the second compound can be reversely transferred to the triplet energy level $T_1^{H1}$ of the first compound. In this case, the triplet exciton reversely transferred to the first compound where the triplet exciton cannot be emitted is quenched as non-emission so that the triplet exciton energy of the second compound cannot contribute to luminescence.

In addition, an excited singlet exciton energy level $S_1^{H2}$ of the third compound acting as the electron acceptor in the EML2 244, which is designed to implement TTA, can be higher than an excited singlet energy level $S_1^{FD}$ of the fourth compound acting as a photon acceptor. In order to realize the TTA, an excited triplet energy level $T_1^{H2}$ of the third compound can be lower than the excited singlet energy level $S_1^{FD}$ and/or an excited triplet energy level $T_1^{F}$ of the fourth compound.

The singlet exciton energies generated in the fourth compound induce fluorescent emission by exciton recombination. The triplet exciton energies of the fourth compound are transferred to the third compound of which the excited triplet energy level $T_1^{H2}$ is lower than the triplet energy level $T_1^{F}$ of the fourth compound. The third compound can be excited to the excited triplet energy level $T_1^{H2}$ with receiving the exciton energies by triplet-triplet energy transfer (TTEF) and/or from the excited triplet energies of the second compound. The third compound generates excitons at the excited singlet energy level $S_1^{H2}$ state by TTA mechanism with combining excitons at other excitons at the triplet energy level $T_1^{H2}$ state. The exciton energies at the excited singlet energy level $S_1^{H2}$ of the third compound are transferred to the excited singlet energy level $S_1^{FD}$ of the fourth compound via Forster Resonance Energy Transfer (FRET) mechanism. The fourth compound emits light with utilizing both the initial singlet exciton energies and the triplet singlet energies parts of which are transformed in the third compound.

Figure 5:
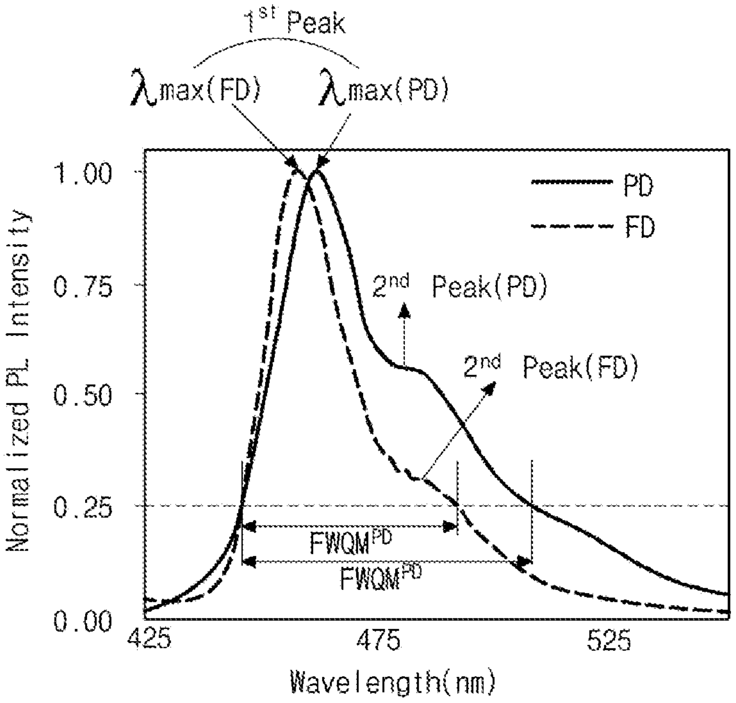
FIG. 5 is a schematic graph illustrating photoluminescence (PL) spectra of the phosphorescent material and the fluorescent material in an EML in accordance with the present disclosure.

In order to implement excellent luminous properties, it is necessary to adjust photoluminescence (PL) properties between the second compound of the phosphorescent material and the fourth compound of the fluorescent material. FIG. 5 is a schematic graph illustrating photoluminescence (PL) spectra of the phosphorescent material and the fluorescent material in an EML in accordance with the present disclosure.

A maximum PL peak λmax(PD) of the second compound can be equal to or less than about 470 nm, for example, between about 455 nm and about 465 nm, but is not limited thereto. A maximum PL peak λmax(FD) of the fourth compound can be within about 15 nm compared to the maximum PL peak λmax(PD) of the second compound. In one aspect, the maximum PL peak λmax(FD) of the fourth compound can be, but is not limited to, between about 440 nm and about 470 nm. In addition, a Full-width at quarter maximum $FWQM^{FD}$ of the fourth compound can be narrower than a Full-width at quarter maximum $FWQM^{PD}$ of the second compound. As an example, the second compound can have the $FWQM^{PD}$ between about 60 nm and about 80 nm, and the fourth compound can have the $FWQM^{FD}$ between about 40 nm and about 60 nm, but is not limited thereto.

In addition, a ratio of an intensity of a second emission peak (e.g. emission peak formed at relatively longer wavelength ranges among plural emission peaks) to an intensity of a first emission peak (e.g., emission peak formed at relatively shorter wavelength ranges among plural emission peaks) can be equal to or less than about 0.65, for example, between about 0.20 and about 0.65. In this case, the excited triplet energy level of the second compound can be minimized to implement luminous stability, and the fourth compound can emit deed blue light with improving color purity and minimizing the reduction in light-coupling efficiency.

On the other hand, when the second emission peak intensity is greater than the first emission peak intensity in the second compound, in other words, the second emission peak is the maximum emission peak λmax (PD), the first emission peak, which is involved with the triplet exciton energy, is shifted too shorter wavelength ranges. As the excited triplet energy level of the second compound is too high and the triplet excitons are quenched in the first compound of the first host, the luminous lifespan as well as the luminous efficiency of the OLED D1 can be deteriorated. In addition, as the $FWQM^{PD}$ of the emission light becomes large, the light-coupling efficiency in the EML 240 can be reduced greatly.

Returning to FIG. 3, the HIL 250 is disposed between the first electrode 210 and the HTL 260 and improves an interface property between the inorganic first electrode 210 and the organic HTL 260. In one aspect, the HIL 250 can include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine and combination thereof.

In another aspect, the HIL 260 can include the following hole transporting material doped with hole injection dopant (p-dopant). The hole injection dopant can include, but is not limited to, HAT-CN, CuPc, 2,3,5,6-Tetrafluoro-7,7,8,8-tetracyanoquinodimethane (F4-TCNQ), 7,7,8,8-Tetracyanoquinodimethane (F6-TCNQ), 2,2-(perfluoronaphthalene-2,6-diylidene)-dimalononitrile (F6-TCNNQ), $FeCl_3$, $V_2O_5$, $WO_3$, $MoO_3$, $ReO_3$, $Fe_3O_4$, $MnO_2$, $SnO_2$, $CoO_2$, $TiO_2$ and combination thereof. In this case, the contents of the hole injection dopant in the HIL 250 can be, but is not limited to, about 1 to about 10 wt %. The HIL 250 can be omitted in compliance with a structure of the OLED D1.

The HTL 260 is disposed between the HIL 250 and the EML 240. In one aspect, the HTL 260 can include, but is not limited to, N,N'-Diphenyl-N,N'-bis(3-methylphenyl)-1,1'-biphenyl-4,4'-diamine (TPD), NPB, 4,4'-Bis(N-carbazolyl)-1,1'-biphenyl (CBP), Poly[N,N'-bis(4-butylphenyl)-N,N'-bis (phenyl)-benzidine] (Poly-TPD), Poly[(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl]cyclohexane (TAPC), 5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine and combination thereof.

The ETL 270 and the EML 280 can be laminated sequentially between the EML 240 and the second electrode 230. The ETL 270 includes material having high electron mobility so as to provide electrons stably with the EML 240 by fast electron transportation. In one aspect, the ETL 270 can include, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 can include, but is not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,08)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2-phenyl-9-(3-(2-phenyl-1,10-phenanthrolin-9-yl)phenyl)-1,10-phenanthroline(PBPPhen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl) biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris (phenylquinoxaline) (TPQ), Diphenyl[4-(triphenylsilyl) phenyl]phosphine oxide (TSPO1) and combination thereof.

The EML 280 is disposed between the second electrode 230 and the ETL 270, and can improve physical properties of the second electrode 230 and therefore, can enhance the luminous lifespan of the OLED D1. In one aspect, the EML 280 can include, but is not limited to, an alkali metal halide or an alkaline earth metal halide such as LiF, CsF, NaF, $BaF_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 can have short lifespan and reduced luminous efficiency. In order to prevent these phenomena, the OLED D1 in accordance with this aspect of the present disclosure can have at least one exciton blocking layer adjacent to the EML 240.

For example, the OLED D1 of one aspect includes the EBL 265 between the HTL 260 and the EML 240 so as to control and prevent electron transfers. In one aspect, the EBL 265 can comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-Bis(N-carbazolyl) benzene (mCP), 3,3-Di(9H-carbazol-9-yl)biphenyl (mCBP), CuPc, N,N'-bis[4-(bis(3-methylphenyl)amino) phenyl]-N,N'-diphenyl-[1,1'-biphenyl]-4,4'-diamine (DNTPD), TDAPB, 3,6-bis(N-carbazolyl)-N-phenyl-carbazole and combination thereof.

In addition, the OLED D1 can further include the HBL 275 as a second exciton blocking layer between the EML 240 and the ETL 270 so that holes cannot be transferred from the EML 240 to the ETL 270. In one aspect, the HBL 275 can comprise, but is not limited to, any one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 can include a compound having a relatively low HOMO energy level compared to the HOMO energy level of the luminescent materials in EML 240. The HBL 275 can include, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

The OLED D1 in accordance with one aspect includes the EML1 242 including the phosphorescent material and the EML2 244 implementing the TTA and disposed adjacently to the EML1 242. The OLED D1 can implement deep blue light with excellent color purity and maximize luminous lifespan.

In an alternative aspect, an OLED can include multiple emitting parts. FIG. 6 is a schematic cross-sectional view illustrating an OLED in accordance with another aspect of the present disclosure. As illustrated in FIG. 6, the OLED D2 includes first and second electrodes 210 and 230 facing each other and an emissive layer 220A with two emitting parts disposed between the first and second electrodes 210 and 230. The organic light emitting display device 100 (FIG. 2) includes a red pixel region, a green pixel region and a blue pixel region, and the OLED D2 can be disposed in the blue pixel region. The first electrode 210 can be an anode and the second electrode 230 can be a cathode.

The emissive layer 220A includes a first emitting part 320 that includes a first EML (lower EML) 340 and a second emitting part 420 that includes a second EML (upper EML) 440. Also, the emissive layer 220A can further include a charge generation layer (CGL) 380 disposed between the first emitting part 320 and the second emitting part 420.

The CGL 380 is disposed between the first and second emitting parts 320 and 420 so that the first emitting part 320, the CGL 380 and the second emitting part 420 are sequentially disposed on the first electrode 210. In other words, the first emitting part 320 is disposed between the first electrode 210 and the CGL 380 and the second emitting part 420 is disposed between the second electrode 230 and the CGL 380.

The first emitting part 320 includes the lower EML 340. The first emitting part 320 can further includes at least one of an HIL 350 disposed between the first electrode 210 and the lower EML 340, a first HTL (HTL1) 360 disposed between the HIL 350 and the lower EML 340 and a first ETL (ETL1) 370 disposed between the lower EML 340 and the CGL 380. Alternatively, the first emitting part 320 can further include a first EBL (EBL1) 365 disposed between the HTL1 360 and the lower EML 340 and/or a first HBL (HBL1) 375 disposed between the lower EML 340 and the ETL1 370.

The second emitting part 420 includes the upper EML 440. The second emitting part 420 can further include at least one of a second HTL (HTL2) 460 disposed between the CGL 380 and the upper EML 440, a second ETL (ETL2) 470 disposed between the upper EML 440 and the second electrode 230 and an EML 480 disposed between the ETL2 470 and the second electrode 230. Alternatively, the second emitting part 420 can further include a second EBL (EBL2) 465 disposed between the HTL2 460 and the upper EML 440 and/or a second HBL (HBL2) 475 disposed between the upper EML 440 and the ETL2 470.

The CGL 380 is disposed between the first emitting part 320 and the second emitting part 420. The first emitting part 320 and the second emitting part 420 are connected via the CGL 380. The CGL 380 can be a PN-junction CGL that junctions an N-type CGL (N-CGL) 382 with a P-type CGL (P-CGL) 384.

The N-CGL 382 is disposed between the ETL1 370 and the HTL2 460 and the P-CGL 384 is disposed between the N-CGL 382 and the HTL2 460. The N-CGL 382 transports electrons to the EML1 340 of the first emitting part 320 and the P-CGL 384 transport holes to the EML2 440 of the second emitting part 420.

As an example, the N-CGL 382 can include the electron transporting material doped with electron injection dopant (n-dopant). The electron injection dopant can include, but is not limited to, alkali metal such as Li, Na, K and Cs and/or alkaline earth metal such as Mg, Sr, Ba and Ra. The contents of the electron injection dopant in the N-CGL 382 can be, but is not limited to, between about 0.05 and about 5 wt %. When the N-CGL 382 includes the contents of the electron injection dopant more than 5 wt %, too many electrons are injected, and the electron leakage can be caused or the driving voltages can be raised.

The P-CGL 384 can include the hole injection material doped with the hole injection dopant. As an example, the contents of the hole injection dopant in the P-CGL can be between about 10 and about 20 wt %.

In this aspect, each of the lower EML 340 and the upper EML 440 can be a blue emitting material layer. For example, the lower EML 340 can include a first EML 342 including the first compound and the second compound and a second EML 344 including the third compound and the fourth compound. The upper EML 440 can include a first EML 442 including the first compound and the second compound and a second EML 444 including the third compound and the fourth compound. Alternatively, each of the first EMLs 342 and 442 can include the third compound and the fourth compound and each of the second EMLs 344 and 444 can include the first compound and the second compound, respectively.

Each of the first and second compounds included in the first EML 342 of the lower EML 340 can be independently identical to or different from each of the first and second compounds included in the first EML 442 of the upper EML 440, respectively. Each of the third and fourth compounds included in the second EML 344 of the lower EML 340 can be independently identical to or different from each of the third and fourth compounds included in the second EML 444 of the upper EML 440, respectively.

Alternatively, at least one of the lower EML 340 and the upper EML 440, for example, the upper EML 440 can have a single-layered structured. In this case, the upper EML 440 can include blue host and blue dopant. The blue dopant can include the first compound. The blue dopant can include at least one of blue phosphorescent material, blue delayed fluorescent material and blue fluorescent material. Accordingly, the upper EML 440 can realize a blue phosphorescent EML, a blue delayed fluorescent EML and/or a blue fluorescent EML.

In the OLED D2 of the present aspect, each of the lower and upper EMLs 340 and 440 can include first EMLs 342 and 442 including the phosphorescent material and second EMLs 344 and 444 implementing TTA disposed adjacently to the first EMLs 342 and 442, respectively. Moreover, since the OLED D2 has a double stack structure of a blue emitting material layer, the color sense of the OLED D2 can be further improved and the luminous efficiency of the OLED D2 can be further optimized.

FIG. 7 is a schematic cross-sectional view illustrating an organic light emitting display device in accordance with another aspect of the present disclosure. As illustrated in FIG. 7, an organic light emitting display device 500 includes a substrate 510 that defines first to third pixel regions P1, P2 and P3, a thin film transistor Tr disposed over the substrate 510 and an OLED D disposed over the thin film transistor Tr and connected to the thin film transistor Tr. As an example, the first pixel region P1 can be a blue pixel region, the second piex region P2 can be a green pixel region and the third pixel region P3 can be a red pixel region.

The substrate 510 can be a glass substrate or a flexible substrate. For example, the flexible substrate can be any one of a PI substrate, a PES substrate, a PEN substrate, a PET substrate and a PC substrate. A buffer layer 512 is disposed over the substrate 510 and the thin film transistor Tr is disposed over the buffer layer 512. The buffer layer 512 can be omitted. As illustrated in FIG. 2, the thin film transistor Tr includes a semiconductor layer, a gate electrode, a source electrode and a drain electrode and acts as a driving element.

A passivation layer 550 is disposed over the thin film transistor Tr. The passivation layer 550 has a flat top surface and includes a drain contact hole 552 that exposes a drain electrode of the thin film transistor Tr.

The OLED D is disposed over the passivation layer 550, and includes a first electrode 610, for example, connected to the drain electrode of the thin film transistor Tr, and an emissive layer 620 and a second electrode 630 each of which is disposed sequentially on the first electrode 610. The OLED D is disposed in each of the first to third pixel regions P1, P2 and P3 and emits different light in each pixel region. For example, the OLED D in the first pixel region P1 can emit blue light, the OLED D in the second pixel region P2 can emit green light and the OLED D in the third pixel region P3 can emit red light.

The first electrode 610 is separately formed for each of the first to third pixel regions P1, P2 and P3, and the second electrode 630 corresponds to the first to third pixel regions P1, P2 and P3 and is formed integrally.

The first electrode 610 can be one of an anode and a cathode, and the second electrode 630 can be the other of the anode and the cathode. In addition, one of the first electrode 610 and the second electrode 630 can be a transmissive (or semi-transmissive) electrode and the other of the first electrode 610 and the second electrode 630 can be a reflective electrode.

For example, the first electrode 610 can be an anode and can include conductive material having a relatively high work function value, i.e., a transparent conductive oxide layer of transparent conductive oxide (TCO). The second electrode 630 can be a cathode and can include conductive material having relatively low work function value, i.e., a metal material layer of low-resistant metal. For example, the first electrode 610 can include any one of ITO, IZO, ITZO, SnO, ZnO, ICO and AZO, and the second electrode 630 can include Al, Mg, Ca, Ag, alloy thereof (e.g., Mg—Ag) or combination thereof.

When the organic light emitting display device 500 is a bottom-emission type, the first electrode 610 can have a single-layered structure of a transparent conductive oxide layer. Alternatively, when the organic light emitting display device 500 is a top-emission type, a reflective electrode or a reflective layer can be disposed under the first electrode 610. For example, the reflective electrode or the reflective layer can include, but is not limited to, Ag or APC alloy. In the OLED D of the top-emission type, the first electrode 610 can have a triple-layered structure of ITO/Ag/ITO or ITO/APC/ITO. Also, the second electrode 630 is thin so as to have light-transmissive (or semi-transmissive) property.

A bank layer 560 is disposed on the passivation layer 550 in order to cover edges of the first electrode 610. The bank layer 560 corresponds to each of the first to third pixel regions P1, P2 and P3 and exposes a center of the first electrode 610.

An emissive layer 620 is disposed on the first electrode 610. In one aspect, the emissive layer 620 can have a single-layered structure of an EML. Alternatively, the emissive layer 620 can include at least one of an HIL, an HTL, and an EBL disposed sequentially between the first electrode 610 and the EML and/or an HBL, an ETL, an EML and/or CGL disposed sequentially between the EML and the second electrode 630.

In one aspect, the EML of the emissive layer 630 in the first pixel region P1 of the blue pixel region can include the EML1 642 (FIG. 8) including the first compound and the second compound and the EML2 644 (FIG. 8) including the third compound and the fourth compound.

An encapsulation film 570 is disposed over the second electrode 630 in order to prevent outer moisture from penetrating into the OLED D. The encapsulation film 570 can have, but is not limited to, a triple-layered structure of a first inorganic insulating film, an organic insulating film and a second inorganic insulating film.

The organic light emitting display device 500 can have a polarizer in order to decrease external light reflection. For example, the polarizer can be a circular polarizer. When the organic light emitting display device 500 is a bottom-emission type, the polarizer can be disposed under the substrate 510. Alternatively, when the organic light emitting display device 500 is a top emission type, the polarizer can be disposed over the encapsulation film 570.

Figure 8:
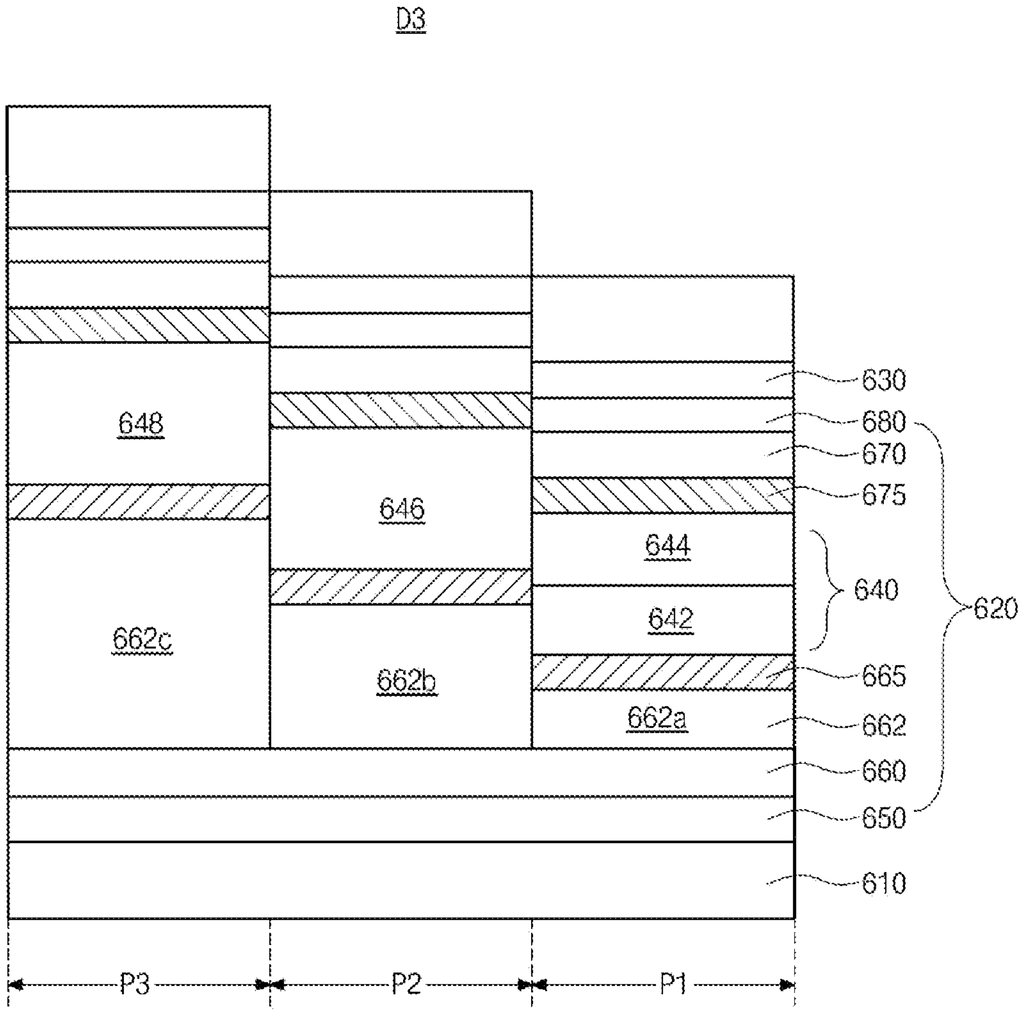
FIG. 8 is a schematic cross-sectional view illustrating an OLED in accordance with still another aspect of the present disclosure.

FIG. 8 is a schematic cross-sectional view illustrating an OLED in accordance with still another aspect of the present disclosure. As illustrated in FIG. 8, the OLED D3 includes a first electrode 610, a second electrode 630 facing the first electrode 610 and an emissive layer 620 disposed between the first and second electrodes 610 and 630.

The first electrode 610 can be an anode and the second electrode 630 can be a cathode. As an example, the first electrode 610 can be a reflective electrode and the second electrode 630 can be a transmissive (or semi-transmissive) electrode.

The emissive layer 620 includes an EML 640. The emissive layer 620 can include at least one of an HTL 660 disposed between the first electrode 610 and the EML 640 and an ETL 670 disposed between the EML 640 and the second electrode 630. Also, the emissive layer 620 can further include at least one of an HIL 650 disposed between the first electrode 610 and the HTL 660 and an EML 680 disposed between the ETL 670 and the second electrode 630. In addition, the emissive layer 620 can further include at least one of an EBL 665 disposed between the HTL 660 and the EML 640 and an HBL 675 disposed between the EML 640 and the ETL 670.

In addition, the emissive layer 620 can further include an auxiliary hole transport layer (auxiliary HTL) 662 disposed between the HTL 660 and the EBL 665. The auxiliary HTL 662 can include a first auxiliary HTL **662*a* located in the first pixel region P1, a second auxiliary HTL 662*b* located in the second pixel region P2 and a third auxiliary HTL 662*c*** located in the third pixel region P3.

The first auxiliary HTL **662*a* has a first thickness, the second auxiliary HTL 662*b* has a second thickness and the third auxiliary HTL 662*c*** has a third thickness. The first thickness is less than the second thickness and the second thickness is less than the third thickness. Accordingly, the OLED D3 has a micro-cavity structure.

Owing to the first to third auxiliary HTLs **662*a*, 662*b* and 662*c* having different thickness to each other, the distance between the first electrode 610 and the second electrode 630 in the first pixel region P1 emitting light in the first wavelength range (blue light) is smaller than the distance between the first electrode 610 and the second electrode 630 in the second pixel region P2 emitting light in the second wavelength range (green light), which is longer than the first wavelength range. In addition, the distance between the first electrode 610 and the second electrode 630 in the second pixel region P2 is smaller than the distance between the first electrode 610 and the second electrode 630** in the third pixel region P3 emitting light in the third wavelength range (red light), which is longer than the second wavelength range. Accordingly, the luminous efficiency of the OLED D5 is improved.

In FIG. 8, the first auxiliary HTL 662*a* is located in the first pixel region P1. Alternatively, the OLED D5 can implement the micro-cavity structure without the first auxiliary HTL 662*a*. In addition, a capping layer can be disposed over the second electrode 630 in order to improve out-coupling of the light emitted from the OLED D3.

The EML 640 includes an EML1 642 and an EML2 644 located in the first pixel region P1, a third EML (EML3) 646 located in the second pixel region P2 and a fourth EML (EML4) 648 located in the third pixel region P3. Each of the EML1 and EML2 642 and 644, the EML3 646 and the EML4 648 can be a blue EML, a green EML and a red EML, respectively.

In one aspect, the EML1 642 located in the first pixel region P1 can include the first compound and the second compound and the EML2 644 can include the third compound and the fourth compound. Alternatively, the EML1 642 can include the third compound and the fourth compound and the EML2 644 can include the first compound and the second compound.

The EML3 646 located in the second pixel region P2 can include a host and a green dopant and the EML4 648 located in the third pixel region P3 can include a host and a red dopant. For example, the host in the EML3 646 and the EML4 648 can include the first compound, and each of the green dopant and the red dopant can include at least one of green or red phosphorescent material, green or red delayed fluorescent material and green or red fluorescent material.

The OLED D3 emits blue light, green light and red light in each of the first to third pixel regions P1, P2 and P3 so that the organic light emitting display device 500 (FIG. 7) can implement a full-color image.

The organic light emitting display device 500 can further include a color filter layer corresponding to the first to third pixel regions P1, P2 and P3 for improving color purity of the light emitted from the OLED D. As an example, the color filter layer can comprise a first color filter layer (blue color filter layer) corresponding to the first pixel region P1, the second color filter layer (green color filter layer) corresponding to the second pixel region P2 and the third color filter layer (red color filter layer) corresponding to the third pixel region P3.

When the organic light emitting display device 500 is a bottom-emission type, the color filter layer can be disposed between the OLED D and the substrate 510. Alternatively, when the organic light emitting display device 500 is a top-emission type, the color filter layer can be disposed over the OLED D.

Figure 9:
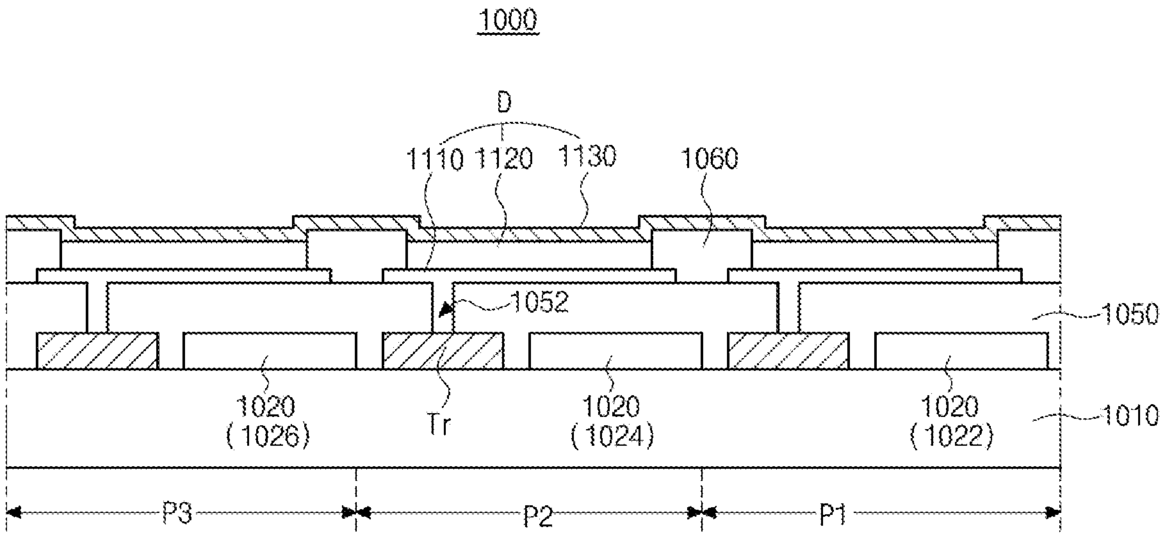
FIG. 9 is a schematic cross-sectional view illustrating an organic light emitting display device in accordance with still another aspect of the present disclosure.

FIG. 9 is a schematic cross-sectional view illustrating an organic light emitting display device in accordance with still another aspect of the present disclosure. As illustrated in FIG. 9, the organic light emitting display device 1000 includes a substrate 1010 defining a first pixel region P1, a second pixel region P2 and a third pixel region P3, a thin film transistor Tr disposed over the substrate 1010, an OLED D disposed over the thin film transistor Tr and connected to the thin film transistor Tr and a color filter layer 1020 corresponding to the first to third pixel regions P1, P2 and P3. As an example, the first pixel region P1 can be a blue pixel region, the second pixel region P2 can be a green pixel region and the third pixel region P3 can be a red pixel region.

The substrate 1010 can be a glass substrate or a flexible substrate. For example, the flexible substrate can be any one of a PI substrate, a PES substrate, a PEN substrate, a PET substrate and a PC substrate. The thin film transistor Tr is located over the substrate 1010. Alternatively, a buffer layer can be disposed over the substrate 1010 and the thin film transistor Tr can be disposed over the buffer layer. As illustrated in FIG. 2, the thin film transistor Tr includes a semiconductor layer, a gate electrode, a source electrode and a drain electrode and acts as a driving element.

The color filter layer 1020 is located over the substrate 1010. As an example, the color filter layer 1020 can include a first color filter pattern 1022 corresponding to the first pixel region P1, a second color filter pattern 1024 corresponding to the second pixel region P2 and a third color filter pattern 1026 corresponding to the third pixel region P3. The first color filter pattern 1022 can be a blue color filter pattern, the second color filter pattern 1024 can be a green color filter pattern and the third color filter pattern 1026 can be a red color filter pattern. For example, the first color filter pattern 1022 can include at least one of blue dye or blue pigment, the second color filter pattern 1024 can include at least one of green dye or green pigment and the third color filter pattern 1026 can include at least one of red dye or red pigment.

A passivation layer 1050 is disposed over the thin film transistor Tr and the color filter layer 1020. The passivation layer 1050 has a flat top surface and includes a drain contact hole 1052 that exposes a drain electrode of the thin film transistor Tr.

The OLED D is disposed over the passivation layer 1050 and corresponds to the color filter layer 1020. The OLED D includes a first electrode 1110, for example, connected to the drain electrode of the thin film transistor Tr, and an emissive layer 1120 and a second electrode 1130 each of which is disposed sequentially on the first electrode 1110. The OLED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally. The first electrode 1110 can be one of an anode and a cathode, and the second electrode 1130 can be the other of the anode and the cathode. In addition, the first electrode 1110 can be a transmissive (or semi-transmissive) electrode and the second electrode 1130 can be a reflective electrode.

For example, the first electrode 1110 can be an anode and can include conductive material having a relatively high work function value, i.e., a transparent conductive oxide layer of transparent conductive oxide (TCO). The second electrode 1130 can be a cathode and can include conductive material having relatively low work function value, i.e., a metal material layer of low-resistant metal. For example, the transparent conductive oxide layer of the first electrode 1110 can include any one of ITO, IZO, ITZO, SnO, ZnO, ICO and AZO, and the second electrode 1130 can include Al, Mg, Ca, Ag, alloy thereof (e.g., Mg—Ag) or combination thereof.

The emissive layer 1120 is disposed on the first electrode 1110. The emissive layer 1120 includes at least two emitting parts emitting different colors. Each of the emitting part can have a single-layered structure of an EML. Alternatively, each of the emitting parts can include at least one of an HIL, an HTL, an EBL, an HBL, an ETL and an EML. In addition, the emissive layer 1120 can further comprise a CGL disposed between the emitting parts.

At least one of the at least two emitting parts can include an EML1 including the first and second compounds and an EML2 including the third and fourth compounds. Alternatively, at least one of the at least two emitting parts can include the EML1 including the third and fourth compounds and the EML2 including the first and second compounds.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the OLED D emits white light in the first to third pixel regions P1, P2 and P3, the emissive layer 1120 can be formed as a common layer without being separated in the first to third pixel regions P1, P2 and P3. The bank layer 1060 is formed to prevent current leakage from the edges of the first electrode 1110, and the bank layer 1060 can be omitted.

Moreover, the organic light emitting display device 1000 can further include an encapsulation film disposed on the second electrode 1130 in order to prevent outer moisture from penetrating into the OLED D. In addition, the organic light emitting display device 1000 can further comprise a polarizer disposed under the substrate 1010 in order to decrease external light reflection.

In the organic light emitting display device 1000 in FIG. 9, the first electrode 1110 is a transmissive electrode, the second electrode 1130 is a reflective electrode, and the color filter layer 1020 is disposed between the substrate 1010 and the OLED D. For example, the organic light emitting display device 1000 is a bottom-emission type. Alternatively, the first electrode 1110 can be a reflective electrode, the second electrode 1120 can be a transmissive electrode (or semi-transmissive electrode) and the color filter layer 1020 can be disposed over the OLED D in the organic light emitting display device 1000 with the top-emission type structure.

In the organic light emitting display device 1000, the OLED D located in the first to third pixel regions P1, P2 and P3 emits white light, and the white light passes through each of the first to third pixel regions P1, P2 and P3 so that each of a blue color, a green color and a red color is displayed in the first to third pixel regions P1, P2 and P3, respectively.

A color conversion film can be disposed between the OLED D and the color filter layer 1020. The color conversion film corresponds to the first to third pixel regions P1, P2 and P3, and includes a green color conversion film, a red color conversion film and a blue color conversion film each of which can convert the white light emitted from the OLED D into green light, red light and blue light, respectively. For example, the color conversion film can include quantum dots. Accordingly, the organic light emitting display device 1000 can further enhance its color purity. Alternatively, the color conversion film can displace the color filter layer 1020.

Figure 10:
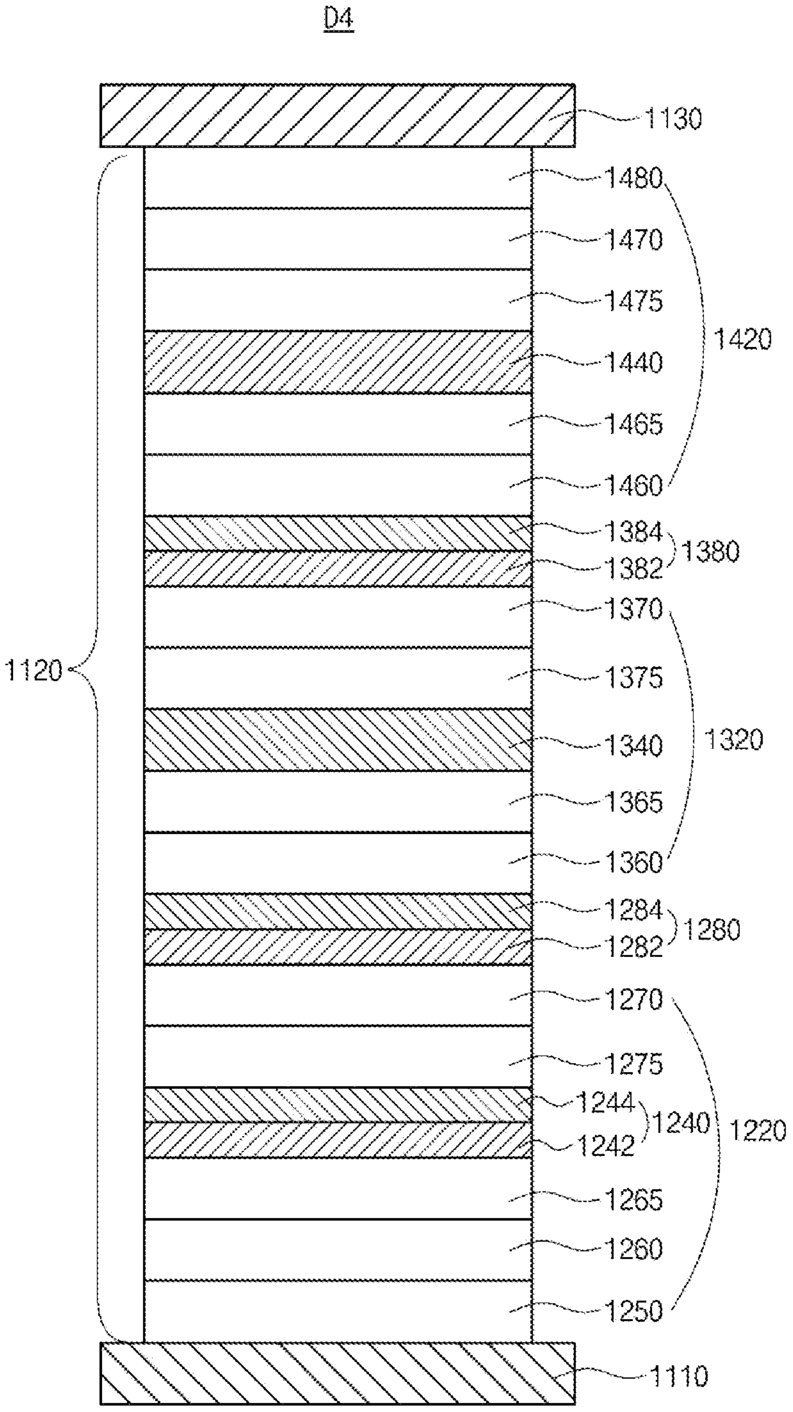
FIG. 10 is a schematic cross-sectional view illustrating an OLED in accordance with still another aspect of the present disclosure.

FIG. 10 is a schematic cross-sectional view illustrating an OLED in accordance with still another aspect of the present disclosure. As illustrated in FIG. 10, the OLED D4 includes first and second electrodes 1110 and 1130 facing each other and an emissive layer 1120 disposed between the first and second electrodes 1110 and 1130. The first electrode 1110 can be an anode and the second electrode 1130 can be a cathode. For example, the first electrode 1100 can be a transmissive electrode and the second electrode 1130 can be a reflective electrode.

The emissive layer 1120 includes a first emitting part 1220, a second emitting part 1320 and a third emitting part 1420. The first emitting part 1220 includes a lower EML 1240, the second emitting part 1320 includes a middle EML 1340, and the third emitting part 1420 includes an upper EML 1440. In addition, the emissive layer 1120 can further includes a first charge generation layer (CGL1) 1280 disposed between the first emitting part 1220 and the second emitting part 1320 and a second charge generation layer (CGL2) 1380 disposed between the second emitting part 1320 and the third emitting part 1420. Accordingly, the first emitting part 1220, the CGL1 1280, the second emitting part 1320, the CGL2 1380 and the third emitting part 1420 are disposed sequentially over the first electrode 1110.

The first emitting part 1220 can further include at least one of an HIL 1250 disposed between the first electrode 1110 and the lower 1240, a first HTL (HTL1) 1260 disposed between the lower EML 1240 and the HIL 1250 and a first ETL (ETL1) 1270 disposed between the lower EML 1240 and the CGL1 1280. Alternatively, the first emitting part 1220 can further include at least one of a first EBL (EBL1) 1265 disposed between the HTL1 1260 and the lower EML 1240 and a first HBL (HBL1) 1275 disposed between the lower EML 1240 and the ETL1 1270.

The second emitting part 1320 can further include at least one of a second HTL (HTL2) 1360 disposed between the CGL1 1280 and the middle EML 1340 and a second ETL (ETL2) 1370 disposed between the middle EML 1340 and the CGL2 1380. Alternatively, the second emitting part 1320 can further include a second EBL (EBL2) 1365 disposed between the HTL2 1360 and the middle EML 1340 and/or a second HBL (HBL2) 1375 disposed between the middle EML 1340 and the ETL2 1370.

The third emitting part 1420 can further include at least one of a third HTL (HTL3) 1460 disposed between the CGL2 1380 and the upper EML 1440, a third ETL (ETL3) 1470 disposed between the upper EML 1440 and the second electrode 1130 and an EML 1480 disposed between the ETL3 1470 and the second electrode 1130. Alternatively, the third emitting part 1420 can further comprise a third EBL (EBL3) 1465 disposed between the HTL3 1460 and the upper EML 1440 and/or a third HBL (HBL3) 1475 disposed between the upper EML 1440 and the ETL3 1470.

The CGL1 1280 is disposed between the first emitting part 1220 and the second emitting part 1320. For example, the first emitting part 1220 and the second emitting part 1320 are connected via the CGL1 1280. The CGL1 1280 can be a PN-junction CGL that junctions a first N-type CGL (N-CGL1) 1282 with a first P-type CGL (P-CGL1) 1284.

The N-CGL1 1282 is disposed between the ETL1 1270 and the HTL2 1360 and the P-CGL1 1284 is disposed between the N-CGL1 1282 and the HTL2 1360. The N-CGL1 1282 transports electrons to the lower EML 1240 of the first emitting part 1220 and the P-CGL1 1284 transport holes to the middle EML 1340 of the second emitting part 1320.

The CGL2 1380 is disposed between the second emitting part 1320 and the third emitting part 1420. For example, the second emitting part 1320 and the third emitting part 1420 are connected via the CGL2 1380. The CGL2 1380 can be a PN-junction CGL that junctions a second N-type CGL (N-CGL2) 1382 with a second P-type CGL (P-CGL2) 1384.

The N-CGL2 1382 is disposed between the ETL2 1370 and the HTL3 1460 and the P-CGL2 1384 is disposed between the N-CGL2 1382 and the HTL3 1460. The N-CGL2 1382 transports electrons to the middle EML 1340 of the second emitting part 1320 and the P-CGL2 1384 transport holes to the upper EML 1440 of the third emitting part 1420.

In this aspect, one of the lower, middle and upper EMLs 1240, 1340 and 1440 can be a blue EML, another of the lower, middle and upper EMLs 1240, 1340 and 1440 can be a green EML and the third of the lower, middle and upper EMLs 1240, 1340 and 1440 can be a red EML.

As an example, the upper EML 1240 can be a blue EML, the middle EML 1340 can be a green EML and the upper EML 1440 can be a red EML. Alternatively, the lower EML 1240 can be a red EML, the middle EML 1340 can be a green EML and the upper EML 1440 can be a blue EML. Hereinafter, the OLED D3 where the lower EML 1240 is a blue EML, the middle EML 1340 is a green EML and the upper EML 1440 is a red EML will be described.

The lower EML 1240 can include an EML1 1242 including the first and second compounds and an EML2 1244 including the third and fourth compounds. Alternatively, the EML1 1242 can include the third and fourth compounds and the EML2 1244 can include the first and second compounds.

The middle EML 1340 can include a host and a green dopant and the upper EML 1440 can include a host a red dopant. As an example, the host in each of the middle EML 1340 and the upper EML 1440 can include the first compound and each of the green and red dopants can include at least one of green and red phosphorescent material, green and red delayed fluorescent material and green and red fluorescent material, respectively.

The OLED D3 emits white light in each of the first to third pixel regions P1, P2 and P3 and the white light passes though the color filter layer 1020 (FIG. 9) correspondingly disposed in the first to third pixel regions P1, P2 and P3. Accordingly, the organic light emitting display device 1000 (FIG. 9) can implement a full-color image.

Figure 11:
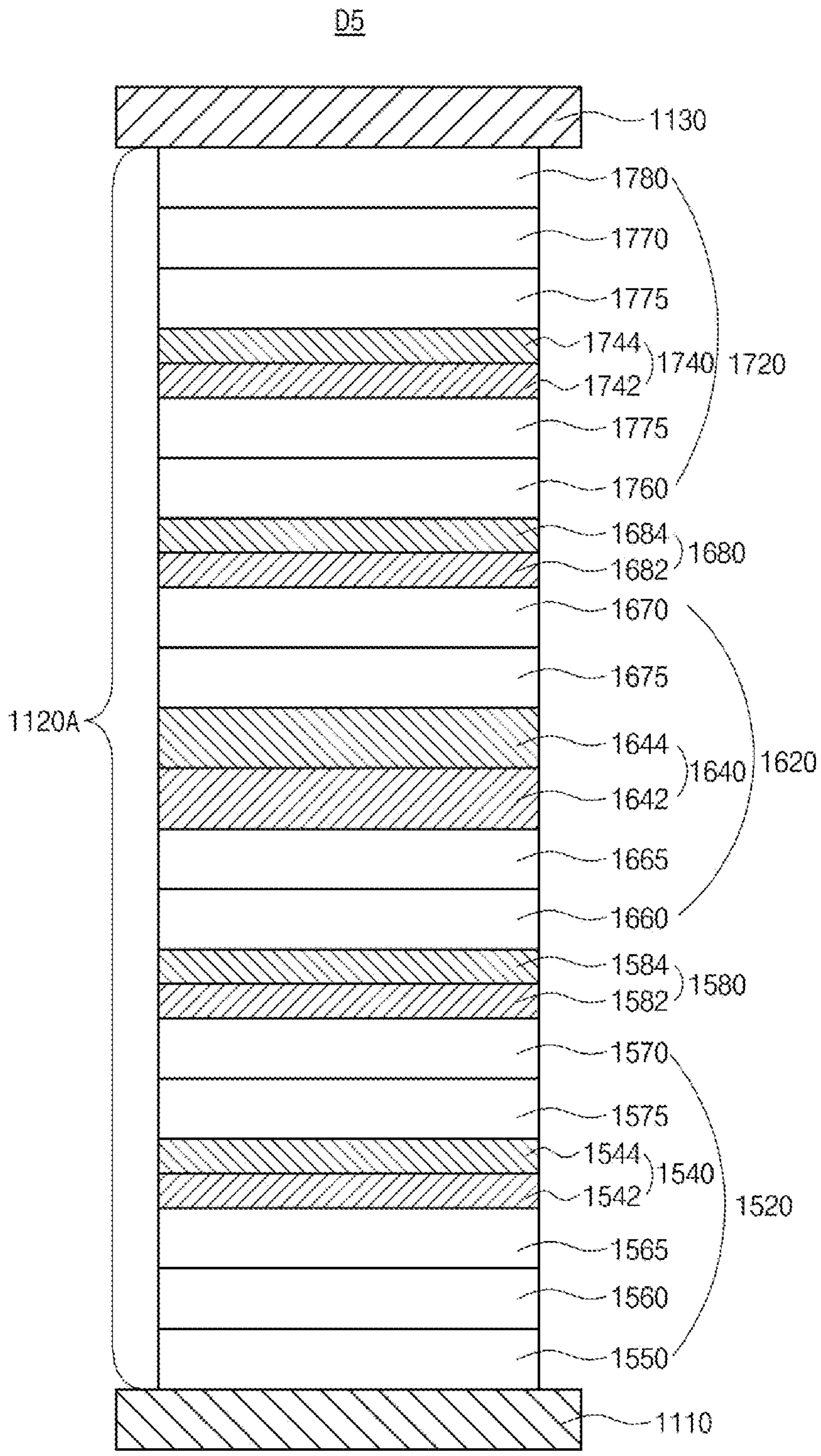
FIG. 11 is a schematic cross-sectional view illustrating an OLED in accordance with still another aspect of the present disclosure.

FIG. 11 is a schematic cross-sectional view illustrating an OLED in accordance with still another aspect of the present disclosure. As illustrated in FIG. 11, the OLED D5 includes first and second electrodes 1110 and 1130 facing each other and an emissive layer 1120A disposed between the first and second electrodes 1110 and 1130. The first electrode 1110 can be an anode and the second electrode 1130 can be a cathode. For example, the first electrode 1100 can be a transmissive electrode and the second electrode 1130 can be a reflective electrode.

The emissive layer 1120A includes a first emitting part 1520 including a lower EML 1540, a second emitting part 1620 including a middle EML 1640 and a third emitting part 1720 including an upper EML 1740. In addition, the emissive layer 1120A can further include a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The first emitting part 1520 can further include at least one of an HIL 1550 disposed between the first electrode 1110 and the lower EML 1540, an HTL1 1560 disposed between the lower EML 1540 and the HIL 1550 and an ETL1 1570 disposed between the lower EML 1540 and the CGL1 1580. Alternatively, the first emitting part 1520 can further comprise an EBL1 1565 disposed between the HTL1 1560 and the lower EML 1540 and/or an HBL1 1575 disposed between the lower EML 1540 and the ETL1 1570.

The middle EML 1640 of the second emitting part 1620 includes a first layer 1642 and a second layer 1644. The first layer 1642 is located adjacently to the first electrode 1110 and the second layer 1644 is located adjacently to the second electrode 1130. In addition, the second emitting part 1620 can further include at least one of an HTL2 1660 disposed between the CGL1 1580 and the middle EML 1640, an ETL2 1670 disposed between the middle EML 1640 and the CGL2 1680. Alternatively, the second emitting part 1620 can further comprise at least one of an EBL2 1665 disposed between the HTL2 1660 and the middle EML 1640 and an HBL2 1675 disposed between the middle EML 1640 and the ETL2 1670.

The third emitting part 1720 can further include at least one of an HTL3 1760 disposed between the CGL2 1680 and the upper EML 1740, an ETL3 1770 disposed between the upper EML 1740 and the second electrode 1130 and an EML 1780 disposed between the ETL3 1770 and the second electrode 1130. Alternatively, the third emitting part 1720 can further include an EBL3 1765 disposed between the HTL3 1760 and the upper EML 1740 and/or an HBL3 1775 disposed between the upper EML 1740 and the ETL3 1770.

The CGL1 1580 is disposed between the first emitting part 1520 and the second emitting part 1620. For example, the first emitting part 1520 and the second emitting part 1620 are connected via the CGL1 1580. The CGL1 1580 can be a PN-junction CGL that junctions an N-CGL1 1582 with a P-CGL1 1584. The N-CGL1 1582 is disposed between the ETL1 1570 and the HTL2 1660 and the P-CGL1 1584 is disposed between the N-CGL1 1582 and the HTL2 1560.

The CGL2 1680 is disposed between the second emitting part 1620 and the third emitting part 1720. For example, the second emitting part 1620 and the third emitting part 1720 are connected via the CGL2 1680. The CGL2 1680 can be a PN-junction CGL that junctions an N-CGL2 1682 with a P-CGL2 1684. The N-CGL2 1682 is disposed between the ETL2 1570 and the HTL3 1760 and the P-CGL2 1684 is disposed between the N-CGL2 1682 and the HTL3 1760.

In this aspect, each of the lower EML 1540 and the upper EML 1740 can be a blue EML. In an aspect, the lower EML 1540 includes an EML1 1542 including the first and second compounds and an EML2 1544 including the third and fourth compounds. The upper EML 1740 includes an EML1 1742 including the first and second compounds and an EML2 1744 including the third and fourth compounds. Alternatively, each of the EML1s 1542 and 1742 can include the third and fourth compounds and each of the EML2s 1544 and 1744 can include the first and second compounds.

In one aspect, each of the first and second compounds included in the EML1 1542 of the lower EML 1540 can be independently identical to or different from each of the first and second compounds include in the EML1 1742 of the upper EML 1740. Alternatively, each of the third and fourth compounds included in the EML2 1544 of the lower EML 1540 can be independently identical to or different from each of the third and fourth compounds included in the EML2 1744 of the upper EML 1740, respectively. In a further alternative aspect, the upper EML 1740 can include another compound, for example, different from at least one of the first to fourth compounds in the lower EML 1540, and thus the upper EML 1740 can emit light different from the light emitted from the lower EML 1540 or can have different luminous efficiency different from the luminous efficiency of the lower EML 1540.

One of the first layer 1642 and the second layer of the middle EML 1640 can be a green EML and the other of the first layer 1642 and the second layer 1644 of the middle EML 1640 can be a red EML. The green EML and the red EML are sequentially disposed to form the middle EML 1640.

As an example, the first layer 1642 of the red EML can include the host and the red dopant and the second layer 1644 can include the host and the green dopant. As an example, the host in the first and second layers 1642 and 1644 can include the first compound, and each of the red and green dopants can include at least one of the red and green phosphorescent material, the red and green delayed fluorescent material and the red and green fluorescent material, respectively.

The OLED D5 emits white light in each of the first to third pixel regions P1, P2 and P3 and the white light passes though the color filter layer 1020 (FIG. 9) correspondingly disposed in the first to third pixel regions P1, P2 and P3. Accordingly, the organic light emitting display device 1000 (FIG. 9) can implement a full-color image.

In FIG. 11, the OLED D5 has a three-stack structure including the first to three emitting parts 1520, 1620 and 1720 which includes the lower EML 1540 and the upper EML 1740 as a blue EML. Alternatively, the OLED D5 can have a two-stack structure where one of the first emitting part 1520 and the third emitting part 1720 each of which includes the lower EML 1540 and the upper EML 1740 as a blue EML is omitted.

Experimental Example 1: Measurement of PL Spectra of Luminous Materials

PL spectra of the Compound 2-7 in Formula 4 and the following Reference Compounds 1 and 2 of the phosphorescent material, and Compounds 4-5 and 4-1 in Formula 8 and the following Reference Compound 3 of the fluorescent material were measured. Compound 2-1 in Formula 2 of the host and each of the phosphorescent materials are admixed with a ratio of 90:10 by weight to form a thin film, and then PL spectra of the phosphorescent materials were measured. Also, Compound 3-1 in Formula 3 of the host and each of the fluorescent materials are admixed with a ratio of 98:2 by weight to form a thin film, and then PL spectra of the fluorescent materials were measured.

[Reference Compounds]

Ref. 1

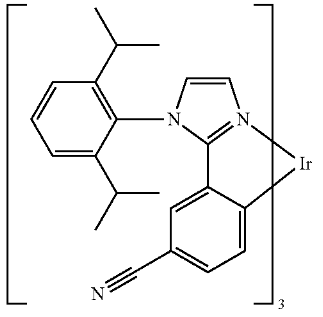

Ref. 2

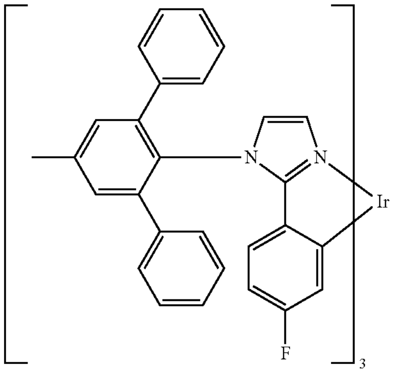

-continued

Ref. 3

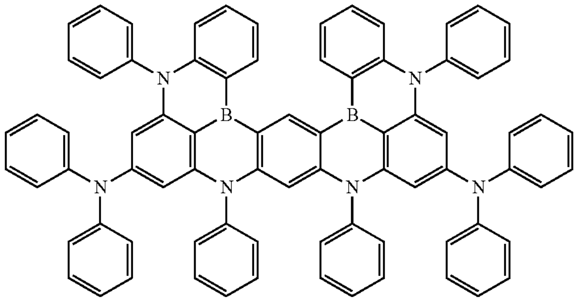

Figure 12:
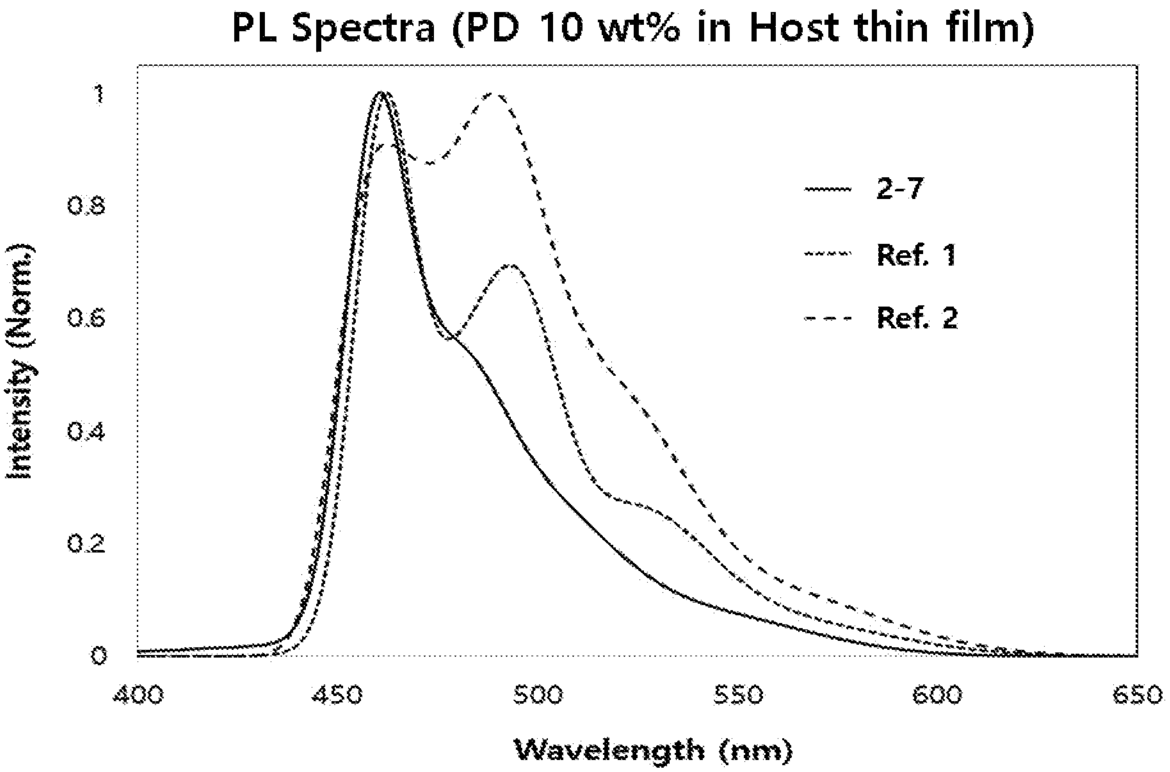
FIGS. 12 and 13 are graphs illustrating PL spectra of the phosphorescent material and the fluorescent material in Examples of the present disclosure.
Figure 13:
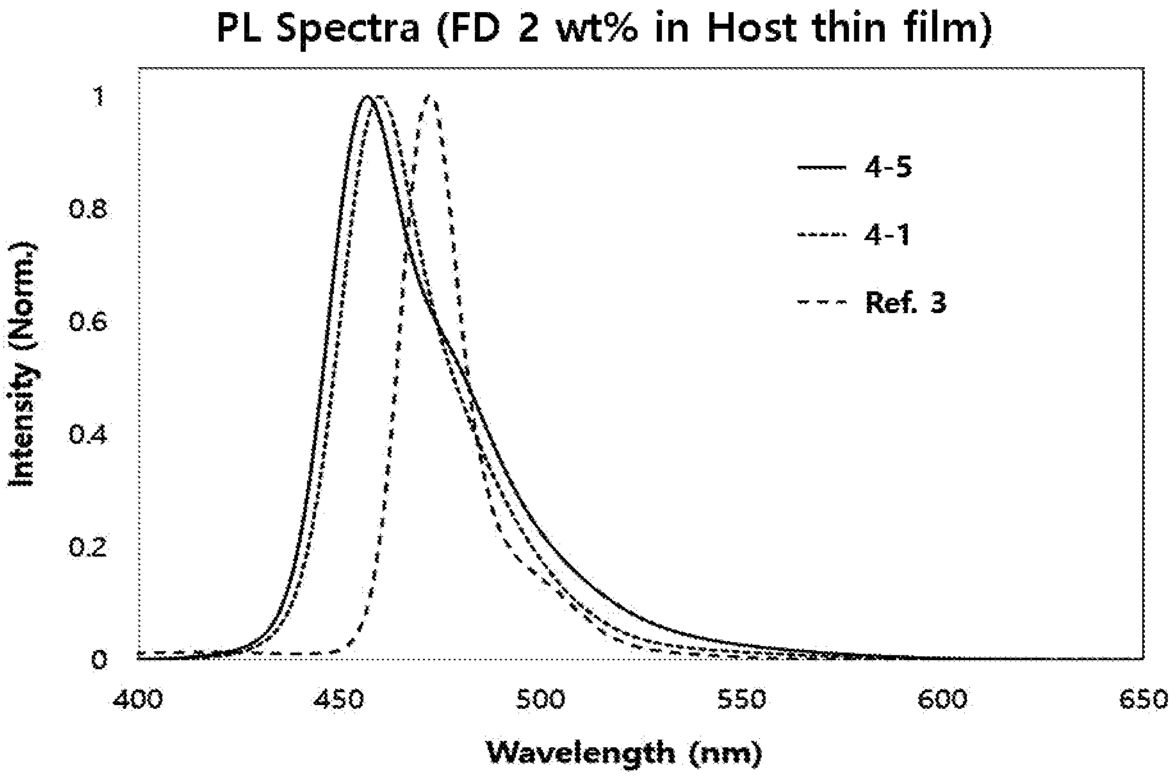
Figure 14:
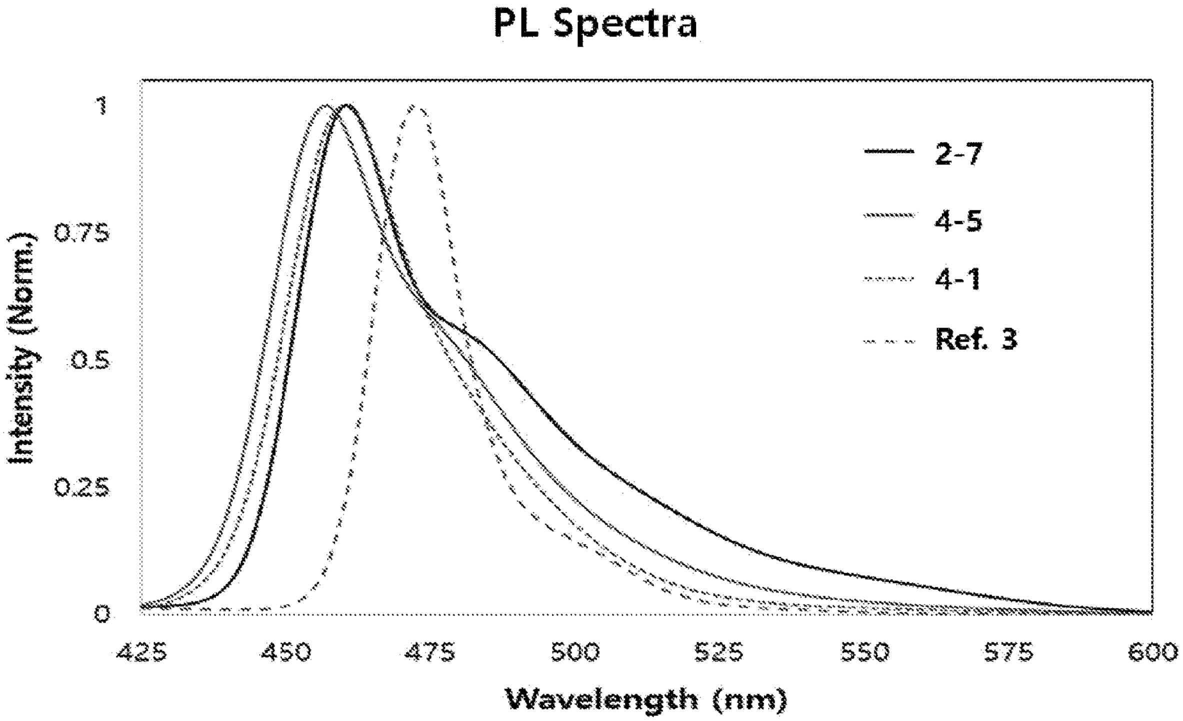
FIGS. 14 and 15 are graphs illustrating PL spectra of the luminous materials and electro-luminescence (EL) spectra of the OLED in Examples of the present disclosure.
Figure 15:
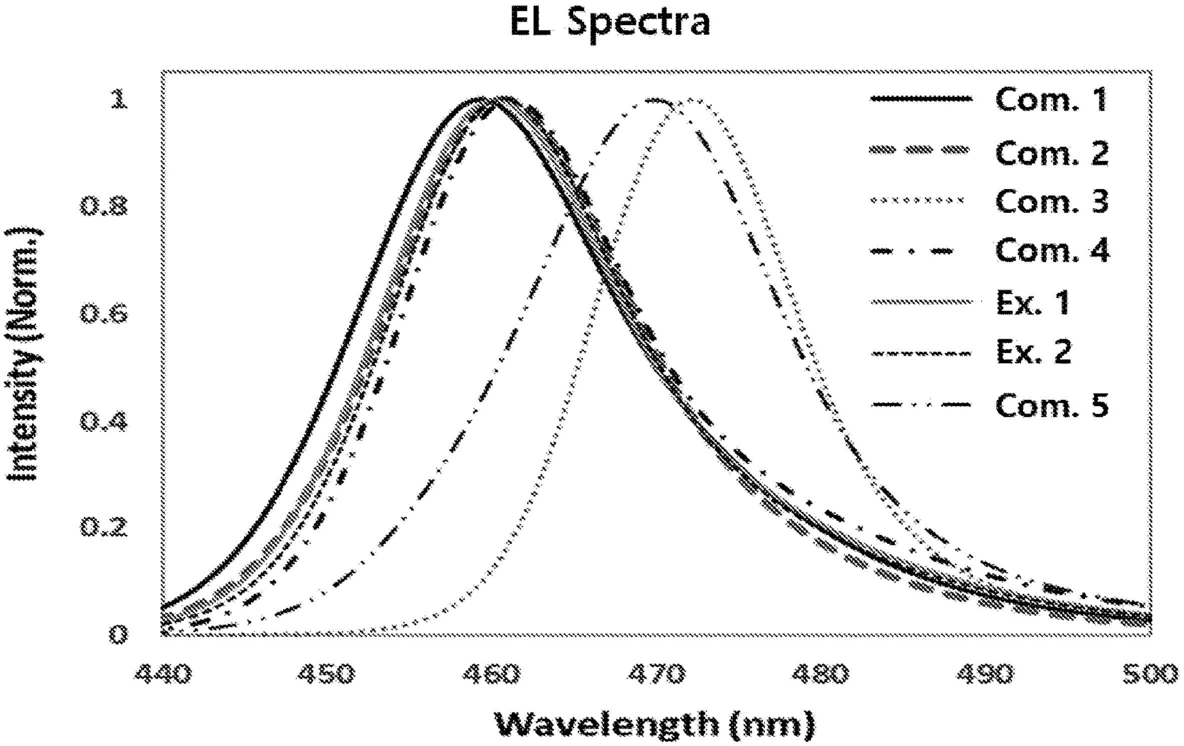
Figure 16:
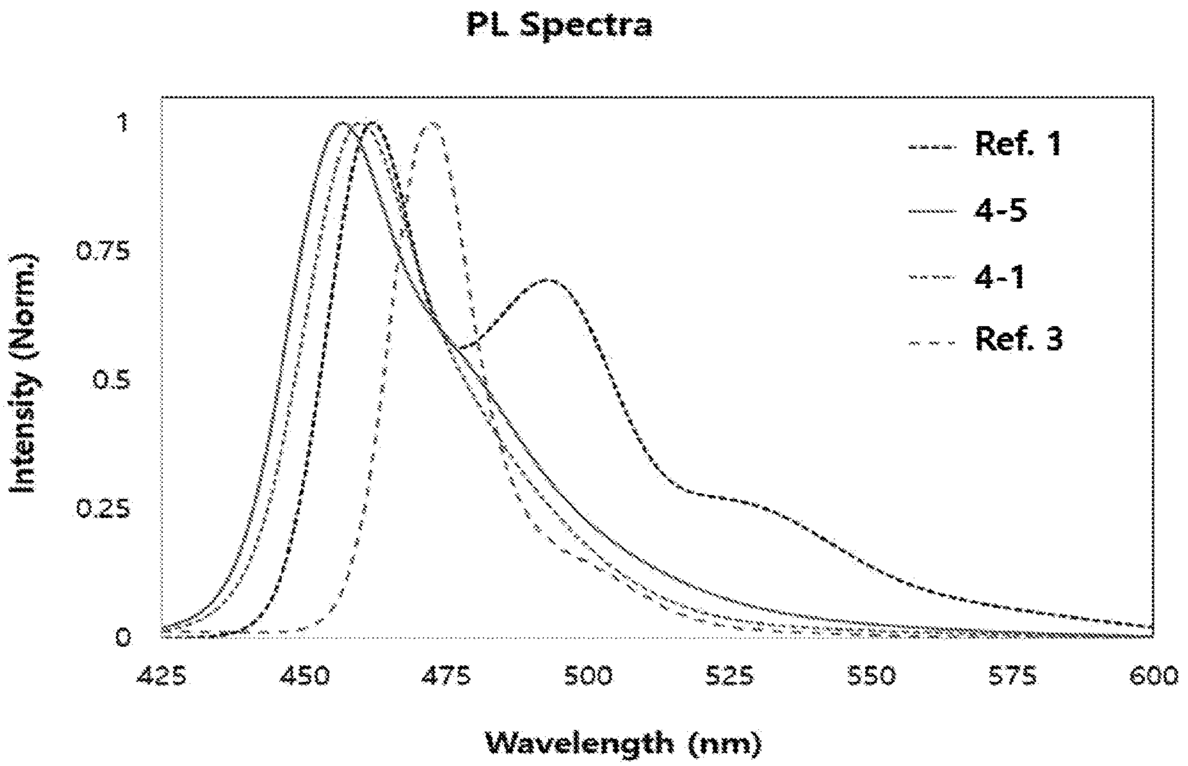
FIGS. 16 to 19 are graphs illustrating PL spectral of the luminous materials and EL spectra of the OLED in Comparative Examples.
Figure 17:
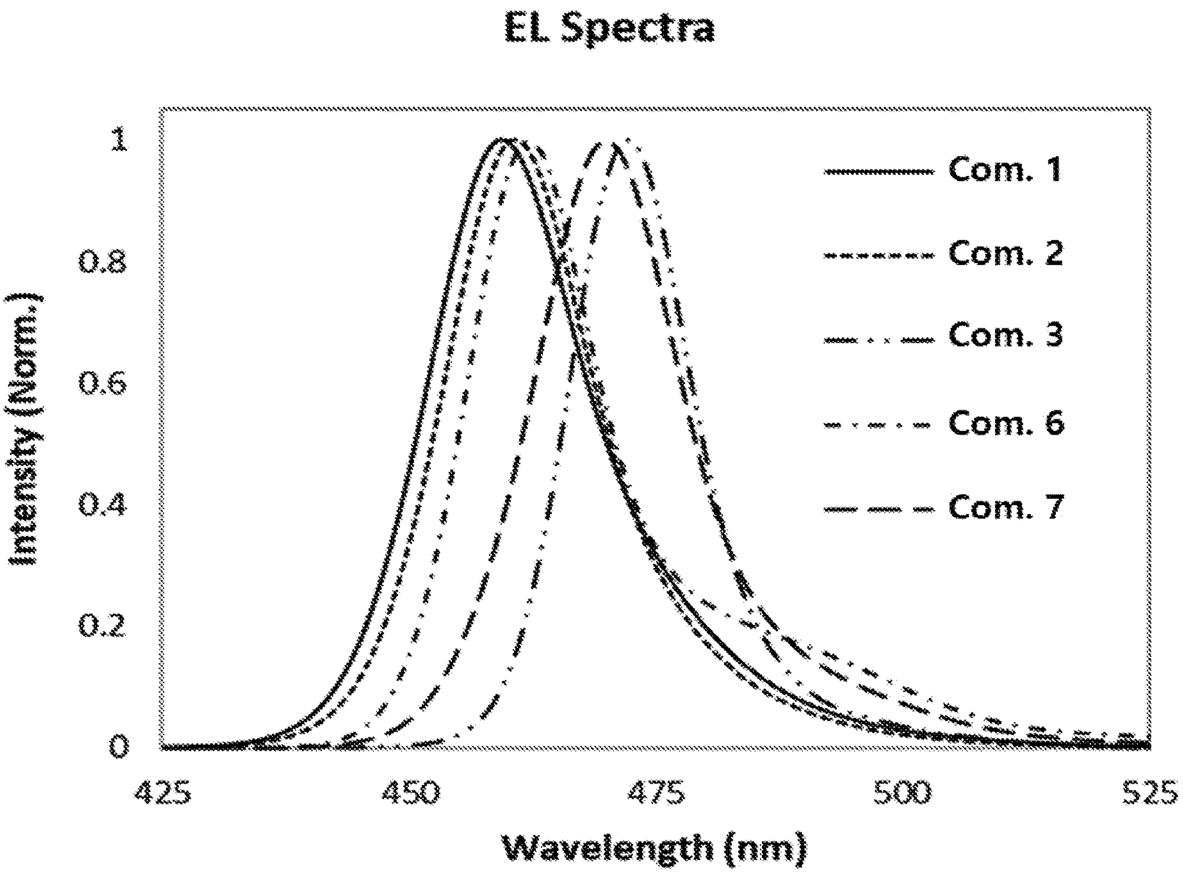
Figure 18:
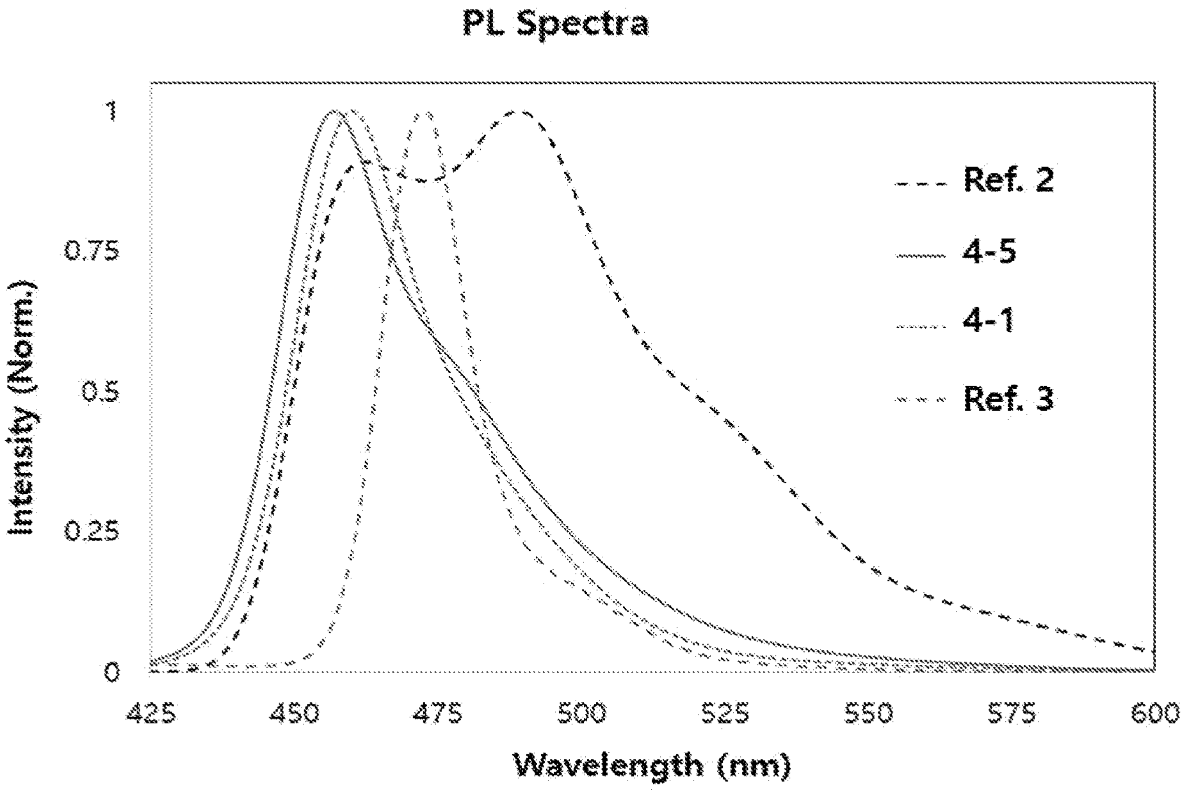
Figure 19:
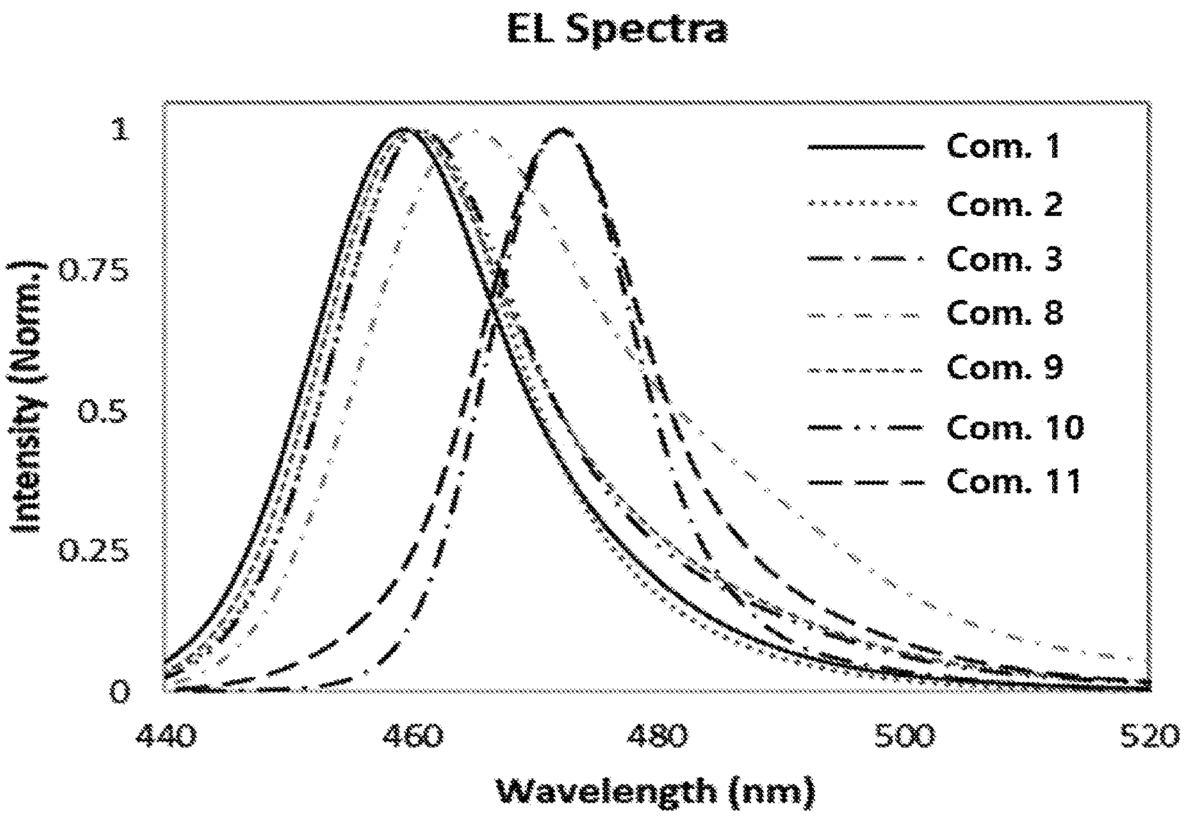

Following Table 1 and FIGS. 12 and 13 illustrates the measurement results for the PL spectra. In Table 1, 1$^{st}$ peak indicates an emission peak of shorter wavelength among emission peaks; 2$^{nd}$ peak indicates an emission peak of longer wavelength among emission peaks; and peak intensity ratio indicates a ratio of the 2' peak intensity to the 1$^{st}$ peak intensity.

TABLE 1

| PL spectra of Phosphorescent and Fluorescent Materials | | | | | |
|---|---|---|---|---|---|
| Materials | $\lambda_{max}$ (nm) | 1$^{st}$ peak (nm) | 2$^{nd}$ peak (nm) | Peak intensity ratio | FWQM (nm) |
| 2-7 | 461 | 461 | 480 | 0.56 | 64 |
| Ref. 1 | 462 | 462 | 493 | 0.69 | 83 |
| Ref. 2 | 489 | 462 | 480 | 1.10 | 98 |
| 4-5 | 457 | 457 | — | — | 57 |
| 4-1 | 460 | 460 | — | — | 50 |
| Ref. 3 | 489 | 489 | — | — | 28 |

Example 1 (Ex. 1): Fabrication of OLED

An OLED in which a first EML (EML1) includes Compounds 1-1 and 2-7 and a second EML (EML2) includes Compound 3-1 and 4-5 was fabricated. The ITO substrate was washed by UV-Ozone treatment before using, and was transferred to a vacuum chamber for depositing emission layer. Subsequently, an anode, an emission layer and a cathode were deposited by evaporation from a heating boat under $10^{-7}$ torr vacuum condition in the following order:

An anode (ITO, 7 nm)-APC (100 nm); an HIL (NPD (90 w %, F4-TCNQ (10 wt %) as P-dopant, 10 nm); an HTL (NPD, 123 nm); an EBL (TAPC, 5 nm); an EML1 (Compound 1-1 (90 wt %), Compound 2-7 (10 wt %), 15 nm); an EML2 (Compound 3-1 (98 wt %), Compound 4-5 (2 wt %), 15 nm); an HBL (B3PYMPM, 5 nm); an ETL (PBPPhen, 25 nm), an EML (LiF, 2 nm); and a cathode (Al (90 wt %), Mg (10 wt %), 12 nm).

After the emissive layer and the cathode were deposited, CPL (capping layer, NPD, 70 nm) was deposited over the cathode, the OLED was transferred from the deposition chamber to a dry box in order to form a film, and then the OLED was encapsulated with UV-cured epoxy and water getter. The materials applied in the emissive layer are indicated below:

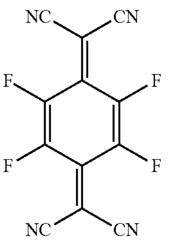

P-dopant(F4-TCNQ)

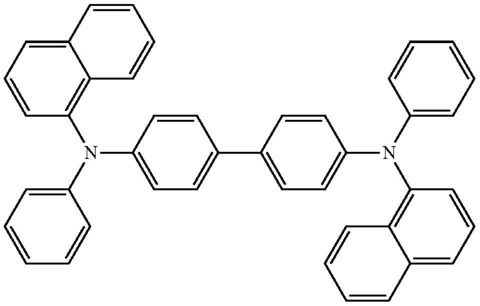

HTL & CPL(NPD)

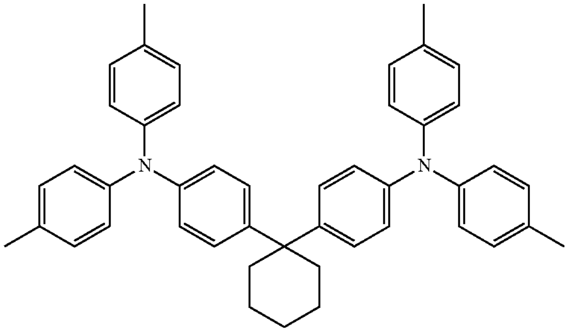

EBL(TAPC)

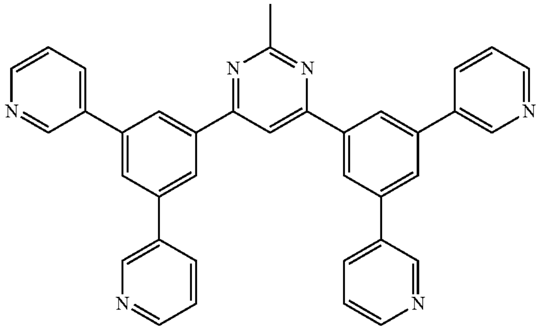

HBL(B3PYMPM)

-continued

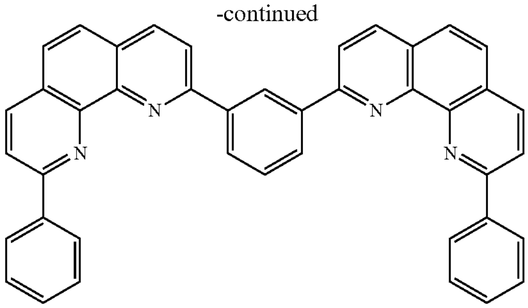

ETL(PBPPhen)

Example 2 (Ex. 2): Fabrication of OLED

An OLED was fabricated using the same materials as Example 1, except that Compound 4-1 in Formula 8 as the fluorescent material in the EML2 was used instead of Compound 4-5.

Example 3 (Ex. 3): Fabrication of OLED

An OLED was fabricated using the same materials as Example 1, except that the EML1 (15 nm) was modified to include Compound 3-1 (98 wt %) and Compound 4-5 (2 wt %) and the EML2 (15 nm) was modified to include the Compound 1-1 (90 wt %) and Compound 2-7 (10 wt %).

Example 4 (Ex. 4): Fabrication of OLED

An OLED was fabricated using the same materials as Example 1, except that the EML1 (15 nm) was modified to include Compound 3-1 (98 wt %) and Compound 4-1 (2 wt %) and the EML2 (15 nm) was modified to include the Compound 1-1 (90 wt %) and Compound 2-7 (10 wt %).

Comparative Example 1 (Com. 1): Fabrication of OLED

An OLED was fabricated using the same material as Example 1, except that the thickness of the HTL was modified to 128 nm and the EML was modified to a single EML (30 nm) including Compound 3-1 (98 wt %) and Compound 4-5 (2 wt %) instead of two EMLs.

Comparative Example 2 (Com. 2): Fabrication of OLED

An OLED was fabricated using the same material as Example 1, except that the thickness of the HTL was modified to 128 nm and the EML was modified to a single EML (30 nm) including Compound 3-1 (98 wt %) and Compound 4-1 (2 wt %) instead of two EMLs.

Comparative Example 3 (Com. 3): Fabrication of OLED

An OLED was fabricated using the same material as Example 1, except that the thickness of the HTL was modified to 135 nm and the EML was modified to a single EML (30 nm) including Compound 3-1 (98 wt %) and Reference Compound 1 (2 wt %) instead of two EMLs.

Comparative Example 4 (Com. 4): Fabrication of OLED

An OLED was fabricated using the same material as Example 1, except that the thickness of the HTL was modified to 128 nm and the EML was modified to a single EML (30 nm) including Compound 1-1 (90 wt %) and Compound 2-7 (10 wt %) instead of two EMLs.

Comparative Example 5 (Com. 5): Fabrication of OLED

An OLED was fabricated using the same material as Example 1, except that the thickness of the HTL was modified to 128 nm and Reference Compound 3 as the fluorescent material in the EML2 was used instead of Compound 4-5.

Comparative Example 6 (Com. 5): Fabrication of OLED

An OLED was fabricated using the same material as Example 1, except that the thickness of the HTL was modified to 128 nm and the EML was modified to a single EML (30 nm) including Compound 1-1 (90 wt %) and Reference Compound 1 (10 wt %) instead of two EMLs.

Comparative Example 7 (Com. 7): Fabrication of OLED

An OLED was fabricated using the same material as Example 1, except that the thickness of the HTL was modified to 128 nm, and Reference Compound 1 as the phosphorescent material in the EML instead of Compound 2-7 and Reference Compound 3 as the fluorescent material in the EML2 instead of Compound 4-5 were used.

Comparative Example 8 (Com. 8): Fabrication of OLED

An OLED was fabricated using the same material as Example 1, except that the thickness of the HTL was modified to 128 nm and the EML was modified to a single EML (30 nm) including Compound 1-1 (90 wt %) and Reference Compound 2 (10 wt %) instead of two EMLs.

Comparative Example 9 (Com. 9): Fabrication of OLED

An OLED was fabricated using the same materials as Example 1, except that Reference Compound 2 as the phosphorescent material in the EML1 was used instead of Compound 2-7.

Comparative Example 10 (Com. 10): Fabrication of OLED

An OLED was fabricated using the same materials as Example 1, except that Reference Compound 2 as the phosphorescent material in the EML1 instead of Compound 2-7 and Compound 4-1 as the fluorescent material in the EML2 instead of Compound 4-5 were used.

Comparative Example 11 (Com. 11): Fabrication of OLED

An OLED was fabricated using the same material as Example 1, except that the thickness of the HTL was modified to 130 nm, and Reference Compound 2 as the phosphorescent material in the EML instead of Compound 2-7 and Reference Compound 3 as the fluorescent material in the EML2 instead of Compound 4-5 were used.

Comparative Example 12 (Com. 12): Fabrication of OLED

An OLED was fabricated using the same materials as Example 1, except that the EML1 (15 nm) was modified to include Compound 3-1 (98 wt %) and Compound 4-5 (2 wt %) and the EML2 (15 nm) was modified to include the Compound 1-1 (90 wt %) and Reference Compound 1 (10 wt %).

Comparative Example 13 (Com. 13): Fabrication of OLED

An OLED was fabricated using the same material as Example 1, except that the thickness of the HTL was modified to 125 nm, and the EML1 (15 nm) was modified to include Compound 3-1 (98 wt %) and Compound 4-1 (2 wt %) and the EML2 (15 nm) was modified to include the Compound 1-1 (90 wt %) and Reference Compound 1 (10 wt %).

Experimental Example 2: Measurement of Luminous Properties of OLED

Each of the OLED with 9 $mm^2$ of emission area fabricated in Ex. 1-4 and Ref. 1-13 was connected to an external power source and then luminous properties for all the diodes were evaluated using a constant current source (KEITHLEY) and a photometer PR650 at room temperature. In particular, driving voltage (V), current efficiency (cd/A), color coordinate (CIEx, CIEy), blue index (BI, cd/A is divided by CIEy), and relative luminous lifespan ($T_{95}$) compared to phosphorescent devices (each of Ex. 1 to 4 and Com. 5 is compared to Com. 4; each of Com. 7 and 12-13 is compared to Com. 6; and each of Com. 9-11 is compared to Com. 8). In addition, PL spectra of the phosphorescent and fluorescent materials and electro-luminescence (EL) spectra for each OLED were measured. The measurement results for the OLEDs are shown in the following tables 2 and FIGS. 14-19:

TABLE 2

Luminous Properties of OLED

| Sample | EML1 | EML2 | cd/A | CIEx | CIEy | BI | $T_{95}$ |
|---|---|---|---|---|---|---|---|
| Com. 1 | 4-5 | | 7.7 | 0.139 | 0.046 | 169 | — |
| Com. 2 | 4-1 | | 7.0 | 0.138 | 0.045 | 156 | — |
| Com. 3 | Ref. 3 | | 18.7 | 0.115 | 0.087 | 216 | — |
| Com. 4 | 2-7 | | 16.5 | 0.134 | 0.062 | 267 | 100 |
| Ex. 1 | 2-7 | 4-5 | 11.1 | 0.137 | 0.052 | 214 | 372 |
| Ex. 2 | 2-7 | 4-1 | 10.6 | 0.137 | 0.051 | 207 | 315 |
| Ex. 3 | 4-5 | 2-7 | 12.0 | 0.137 | 0.057 | 210 | 342 |
| Ex. 4 | 4-1 | 2-7 | 11.7 | 0.136 | 0.057 | 204 | 302 |
| Com. 5 | 2-7 | Ref. 3 | 17.8 | 0.124 | 0.077 | 232 | 252 |
| Com. 6 | Ref. 1 | | 15.4 | 0.131 | 0.078 | 196 | 100 |
| Com. 7 | Ref. 1 | Ref. 3 | 17.2 | 0.121 | 0.085 | 202 | 211 |
| Com. 8 | Ref. 2 | | 17.3 | 0.125 | 0.104 | 165 | 100 |

TABLE 2-continued

| Luminous Properties of OLED | | | | | | | |
|---|---|---|---|---|---|---|---|
| Sample | EML1 | EML2 | cd/A | CIEx | CIEy | BI | $T_{95}$ |
| Com. 9 | Ref. 2 | 4-5 | 10.1 | 0.135 | 0.061 | 165 | 287 |
| Com. 10 | Ref. 2 | 4-1 | 9.6 | 0.135 | 0.061 | 158 | 253 |
| Com. 11 | Ref. 2 | Ref. 3 | 19.4 | 0.116 | 0.102 | 190 | 211 |
| Com. 12 | 4-5 | Ref. 1 | 12.1 | 0.135 | 0.066 | 183 | 251 |
| Com. 13 | 4-1 | Ref. 1 | 13.4 | 0.131 | 0.076 | 177 | 224 |

As indicated in Table 2 and FIGS. 14-19, the OLEDs fabricated in Com. 1-2 in which only the fluorescent materials are used in the EML showed low luminous efficiency and bad BL. The OLEDs fabricated Com. 4, 6 and 8 in which only the phosphorescent materials are used in the EML showed short luminous lifespan. In the OLEDs fabricated in Com. 9-13 in which Ref. Compound 1-2, which has relatively high second peak intensity to the first peak intensity in PL spectra and wide FWQM, are applied into EML, CIEy was increased. Compared to the OLEDs in fabricated Com. 1-3 in which only the fluorescent materials are used in the EML, the BI value in the OLEDs fabricated in Com. 9-13 was reduced, and therefore, showed little color improving effect.

In addition, in the OLEDs in fabricated in Com. 5, 7 and 11 in which Ref. Compound 3, which had maximum PL spectrum greatly different from the maximum PL spectra of the phosphorescent materials (Com. 5, Ref. Compounds 1-2), was used as the fluorescent material, the BI values were greatly reduced as CIEy increases enormously. Particularly, compared to the OLEDs fabricated in Ex. 1-2, the lifespan of the OLED fabricated in Com. 5 was greatly reduced.

On the contrary, compared to the OLEDs fabricated in Com. 1-2, in the OLEDs fabricated in Ex. 1-4 in which the same fluorescent materials as the Com. 1-2 were applied into EML, luminous efficiency was increased greatly by maximum 71.4% and CIEy value was little changed. The OLEDs fabricated in Ex. 1-4 implement deep blue color and excellent color purity as BI value are greatly improved. In addition, Compared to the OLED fabricated in Com. 5, the luminous lifespan of the OLEDs fabricated in Ex. 1-4 were greatly improved. Particularly, in the OLEDs fabricated in Ex. 1-2 in which the fluorescent materials each of which has maximum PL peak wavelength shorter than the maximum PL peak of the phosphorescent materials and has relatively narrow FWQM are introduced in the EML2 relatively adjacent to the cathode, CIEy values were little changed, and thus, BI values and luminous lifespans were further increased.

Comparative Example 14 (Com. 14): Fabrication of OLED

An OLED was fabricated using the same materials as Example 1, except that the EML was modified to a single EML (30 nm) including Compound 1-1 (88 wt %), Compound 2-7 (10 wt %) and Compound 4-5 (2 wt %) instead of two EMLs.

Comparative Example 15 (Com. 15): Fabrication of OLED

An OLED was fabricated using the same materials as Example 1, except that the EML was modified to a single EML (30 nm) including Compound 1-1 (88 wt %), Compound 2-7 (10 wt %) and Compound 4-1 (2 wt %) instead of two EMLs.

Comparative Example 16 (Com. 16): Fabrication of OLED

An OLED was fabricated using the same materials as Example 1, except that the EML was modified to a single EML (30 nm) including Compound 1-1 (88 wt %), Reference Compound 1 (10 wt %) and Compound 4-5 (2 wt %) instead of two EMLs.

Comparative Example 17 (Com. 17): Fabrication of OLED

An OLED was fabricated using the same materials as Example 1, except that the EML was modified to a single EML (30 nm) including Compound 1-1 (88 wt %), Reference Compound 1 (10 wt %) and Compound 4-1 (2 wt %) instead of two EMLs.

Experimental Example 3: Measurement of Luminous Properties of OLED

The luminous properties in each of the OLED in Ex. 1-4 and Ref. 6 and 14-17 were measured as the same procedure as Experimental Example 1. The luminous lifespan of OLEDs in Com. 14-15 is compared to the OLED in Com. 4 and the luminous lifespan of OLEDs in Com. 16-17 is compared to the OLED in Com. 6. The measurement results for the OLEDs are shown in the following Table 3:

TABLE 3

| Luminous Properties of OLED | | | | | | | |
|---|---|---|---|---|---|---|---|
| Sample | EML1 | EML2 | cd/A | CIEx | CIEy | BI | $T_{95}$ |
| Com. 4 | 2-7 | | 16.5 | 0.134 | 0.062 | 267 | 100 |
| Ex. 1 | 2-7 | 4-5 | 11.1 | 0.137 | 0.051 | 214 | 372 |
| Ex. 2 | 2-7 | 4-1 | 10.6 | 0.137 | 0.051 | 207 | 315 |
| Ex. 3 | 4-5 | 2-7 | 12.0 | 0.137 | 0.057 | 210 | 342 |
| Ex. 4 | 4-1 | 2-7 | 11.7 | 0.136 | 0.057 | 204 | 302 |
| Com. 14 | 2-7, 4-5 | | 16.7 | 0.138 | 0.050 | 333 | 48 |
| Com. 15 | 2-7, 4-1 | | 12.5 | 0.137 | 0.049 | 254 | 32 |
| Com. 6 | Ref. 1 | | 15.4 | 0.131 | 0.078 | 196 | 100 |
| Com. 16 | Ref. 1, 4-5 | | 15.6 | 0.137 | 0.053 | 293 | 37 |
| Com. 17 | Ref. 1, 4-1 | | 12.0 | 0.136 | 0.053 | 225 | 26 |

In Com. 14-17, the single EML includes the first compound with high triplet energy level, the phosphorescent material and the fluorescent material. In the single EML, since the concentration of the triplet excitons generated in the phosphorescent material is kept high level and the triplet excitons are not transferred to other adjacent molecules and make the fluorescent materials to be deteriorated, the luminous lifespan of the OLED in Com. 14-17 were greatly reduced. On the contrary, when the EML is divided into the phosphorescent layer and the fluorescent layer as Ex. 1-4, the concentration of the triplet excitons in the phosphorescent layer is reduced owing to exciton dispersion effect. In this case, high energy triplet exciton quenching such as triplet-triplet annihilation (TTA) or triplet-polaron annihilation can be prevented in the phosphorescent layer. In addition, the fluorescent layer includes the third compound with low excited triplet energy level as the host. In this case, the triplet energy level in the fluorescent layer is low and the exciton stability in the fluorescent layer can be improved, and thus, the OLED can implement very excellent luminous lifespan.

It will be apparent to those skilled in the art that various modifications and variations can be made in the OLED and the organic light emitting device including the OLED of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode comprising:

a first electrode;

a second electrode facing the first electrode; and an emissive layer disposed between the first and second electrodes and comprising at least one emitting material layer, wherein the at least one emitting material layer comprises a first emitting material layer and a second emitting material layer disposed adjacent to the first emitting material layer, wherein the first emitting material layer comprises a first compound having the following structure of Formula 1 and a second compound having the following structure of Formula 3, and wherein the second emitting material layer comprises a third compound having the following structure of Formula 5 and a fourth compound having the following structure of Formula 7:

[Formula 1]

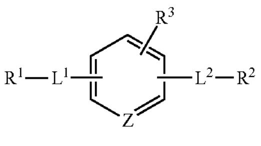

wherein, in Formula 1, each of $R^1$ and $R^2$ is independently an unsubstituted or substituted carbazolyl or an unsubstituted or substituted carboline;

$R^3$ is hydrogen, cyano, unsubstituted or substituted $C_1$-$C_{20}$ alkyl, unsubstituted or substituted $C_6$-$C_{30}$ aryl or unsubstituted or substituted $C_3$-$C_{30}$ hetero aryl;

Z is N or $CR^4$, wherein $R^4$ is hydrogen, unsubstituted or substituted $C_1$-$C_{10}$ alkyl, unsubstituted or substituted $C_6$-$C_{30}$ aryl or unsubstituted or substituted $C_3$-$C_{30}$ hetero aryl; and each of $L^1$ and $L^2$ is independently a single bond, unsubstituted or substituted $C_6$-$C_{30}$ arylene or unsubstituted or substituted $C_3$-$C_{30}$ hetero arylene,

[Formula 3]

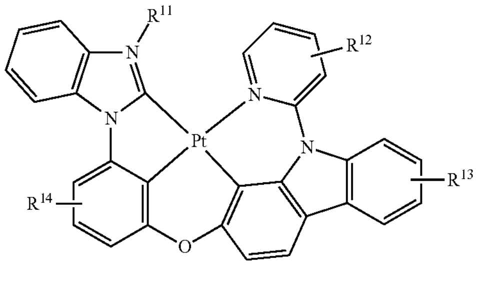

wherein, in Formula 3, each of $R^{11}$ to $R^{14}$ is independently hydrogen, halogen, cyano, unsubstituted or substituted $C_1$-$C_{10}$ alkyl, unsubstituted or substituted $C_1$-$C_{10}$ alkyl amino, unsubstituted or substituted $C_6$-$C_{30}$ aryl, unsubstituted or substituted $C_3$-$C_{30}$ hetero aryl or unsubstituted or substituted adamantyl,

[Formula 5]

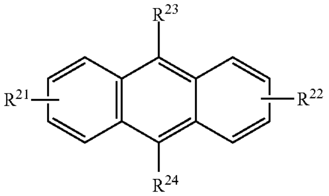

wherein, in Formula 5, each of $R_{21}$ and $R_{22}$ is independently hydrogen, unsubstituted or substituted $C_1$-$C_{20}$ alkyl, unsubstituted or substituted $C_6$-$C_{30}$ aryl or unsubstituted or substituted $C_3$-$C_{30}$ hetero aryl; and each of $R^{23}$ and $R^{24}$ is independently unsubstituted or substituted $C_6$-$C_{30}$ aryl or unsubstituted or substituted $C_3$-$C_{30}$ hetero aryl,

[Formula 7]

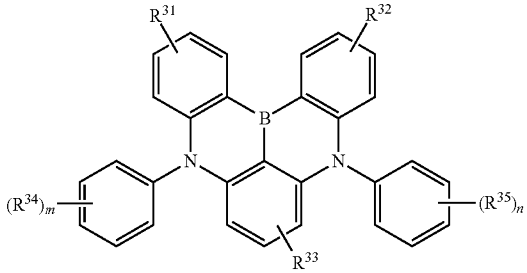

wherein, in Formula 7, each of $R^{31}$ to $R^{33}$ is independently hydrogen, halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino;

each of $R^{34}$ and $R^{35}$ is independently halogen, cyano, unsubstituted or substituted $C_1$-$C_{20}$ alkyl, unsubstituted or substituted $C_6$-$C_{30}$ aryl, unsubstituted or substituted $C_3$-$C_{30}$ hetero aryl or unsubstituted or substituted $C_6$-$C_{30}$ aryl amino, wherein $R^{34}$ is identical to or different from each other when m is an integer of two or more and each $R^{35}$ is identical to or different from each other when n is an integer of two or more; and each of m and n is independently an integer of 0 to 5.

2. The organic light emitting diode of claim 1, wherein the first compound is selected from:

1-1
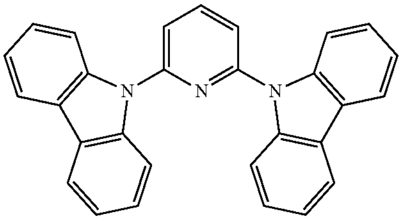
1-2
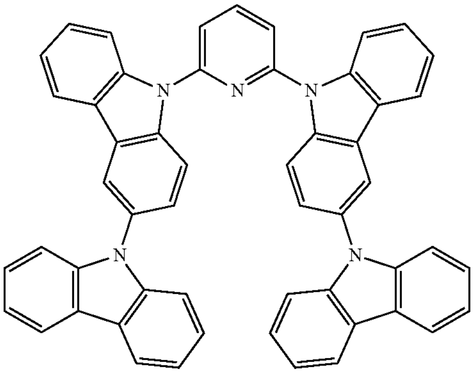
1-3
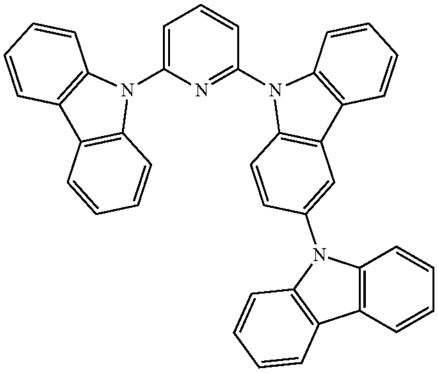
1-4
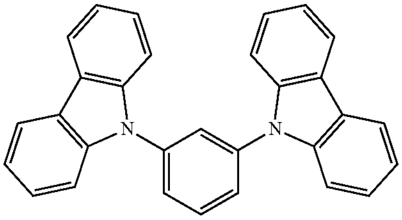
1-5
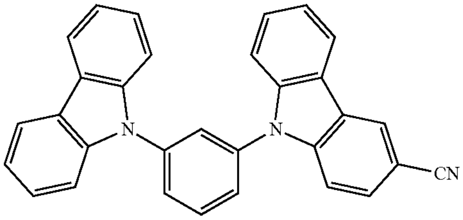
-continued
1-6
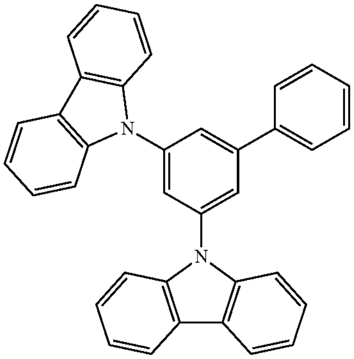
1-7
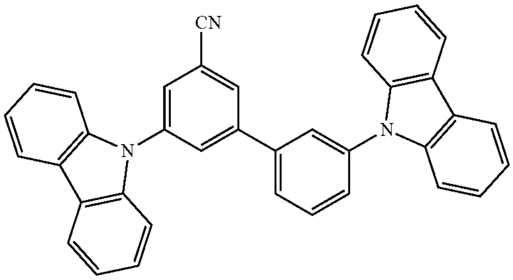
1-8
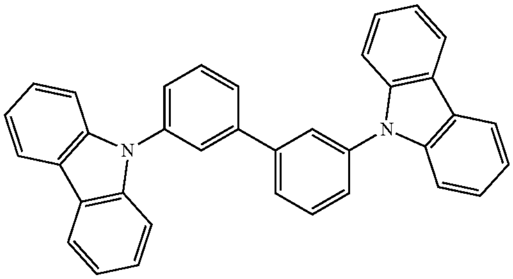
1-9
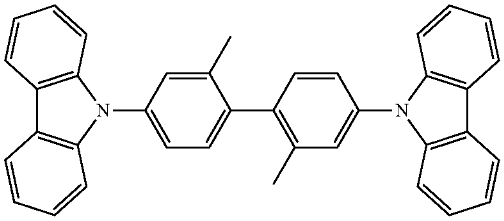
1-10
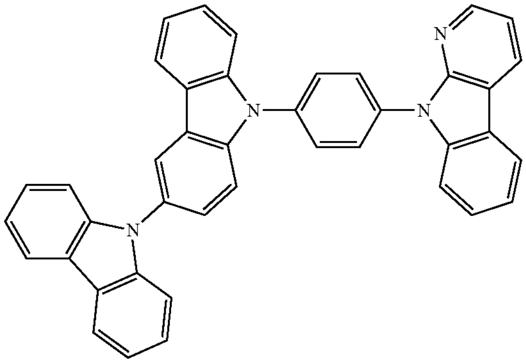

-continued
1-11
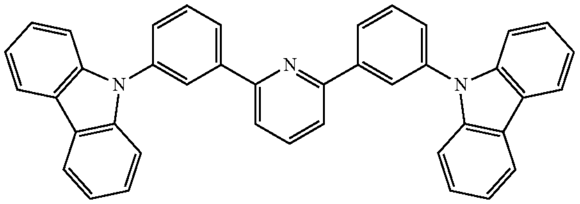
1-12
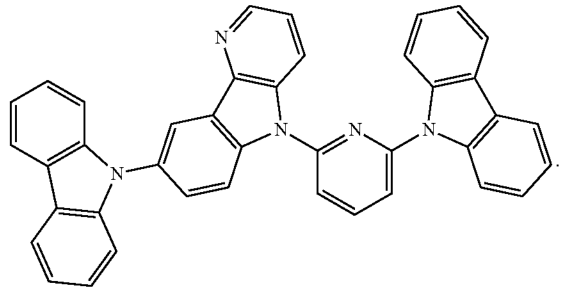
3. The organic light emitting diode of claim 1, wherein the second compound is selected from:
2-1
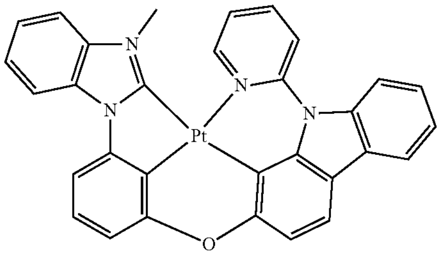
2-2
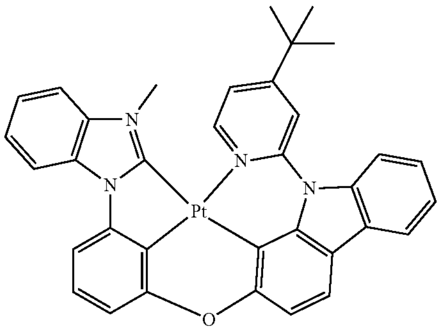
2-3
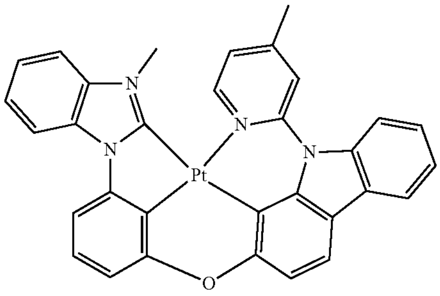
-continued
2-4
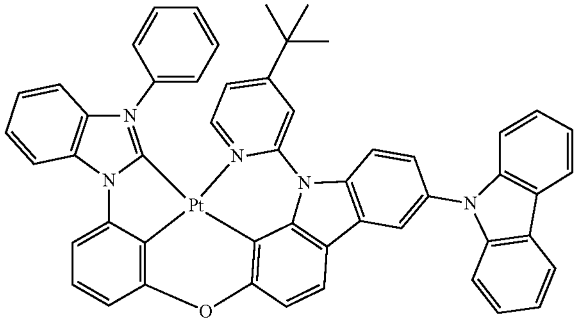
2-5
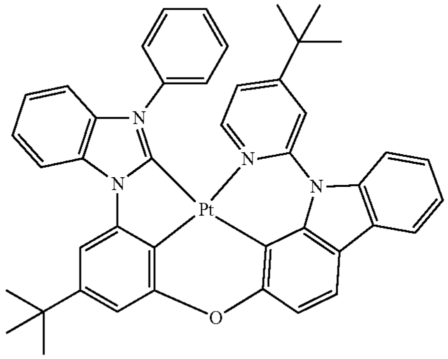
2-6
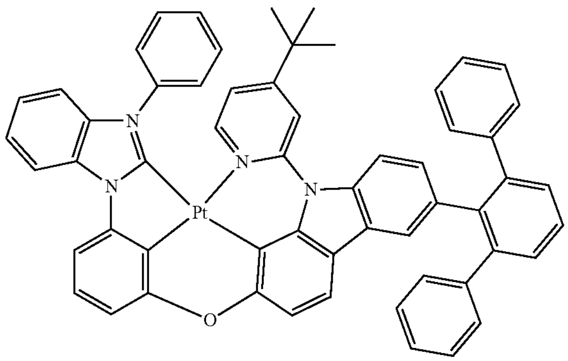
2-7
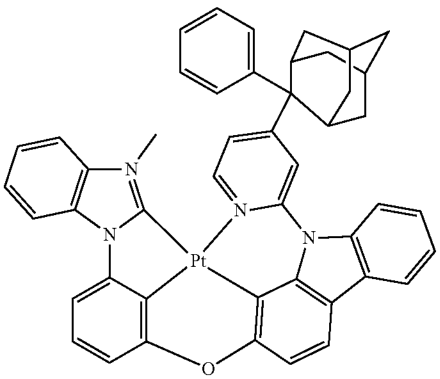

-continued
2-8
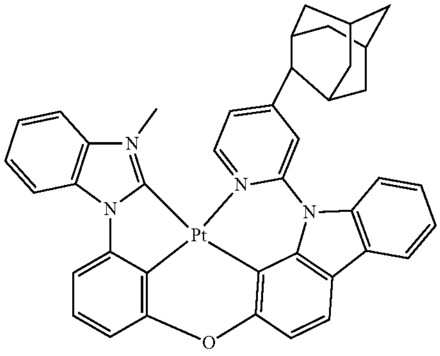
2-9
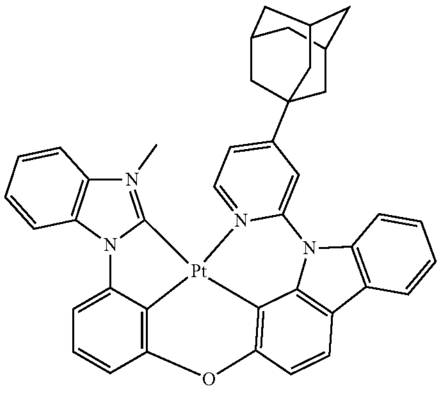
2-10
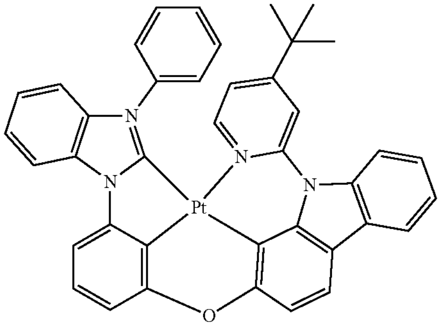
2-11
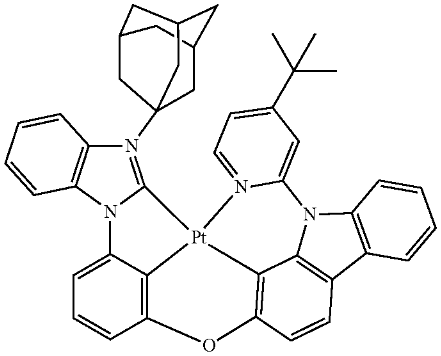
-continued
2-12
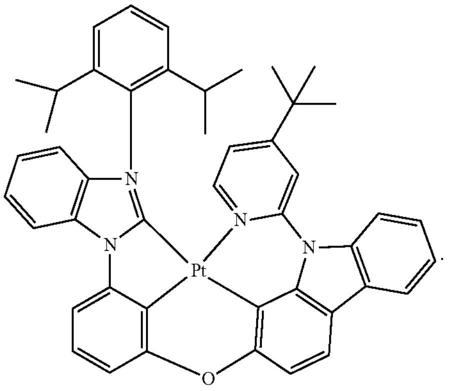
4. The organic light emitting diode of claim 1, wherein the third compound is selected from:
3-1
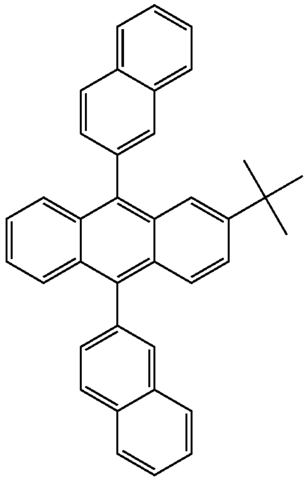
3-2
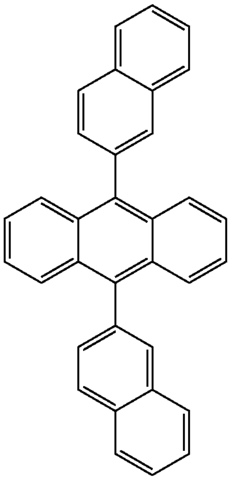

-continued
3-3
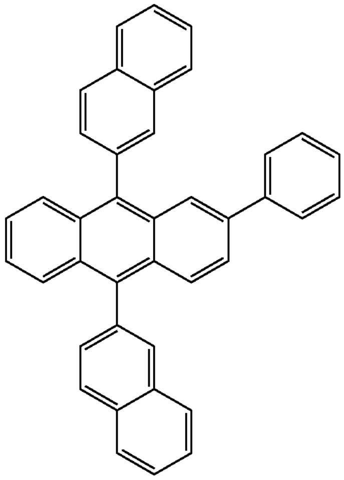
3-4
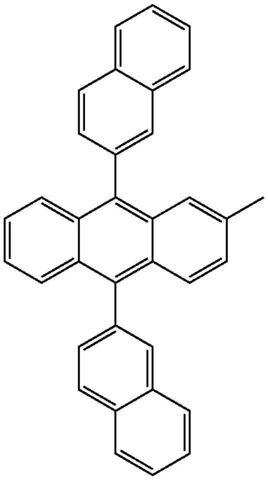
3-5
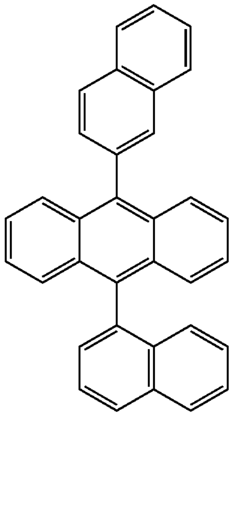
-continued
3-6
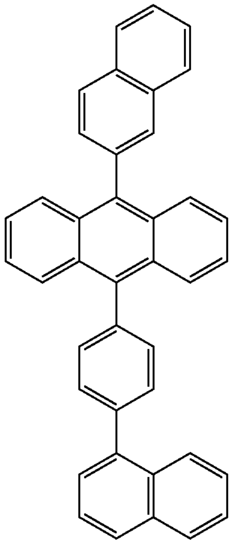
3-7
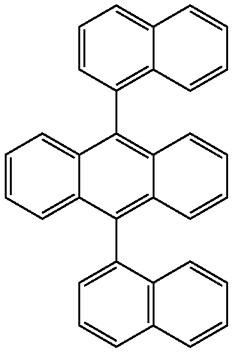
3-8
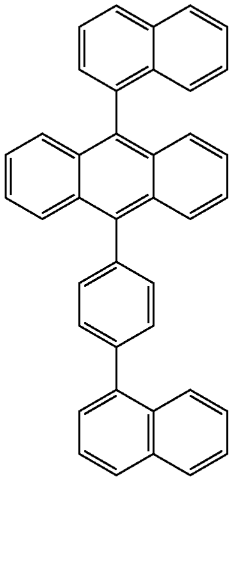

-continued
3-9
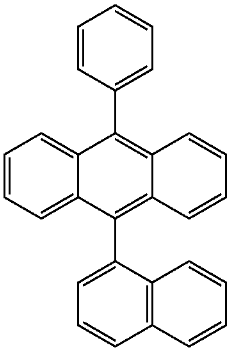
3-10
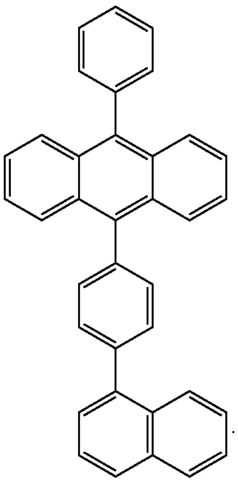
.
5. The organic light emitting diode of claim 1, wherein the fourth compound is selected from:
4-1
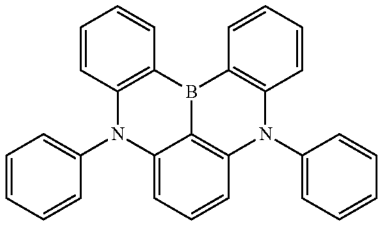
4-2
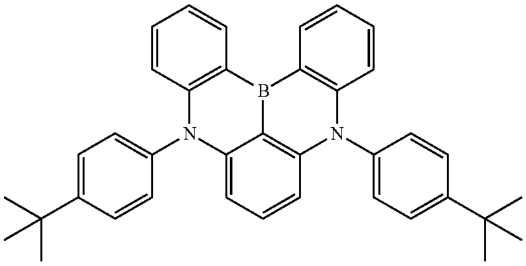
-continued
4-3
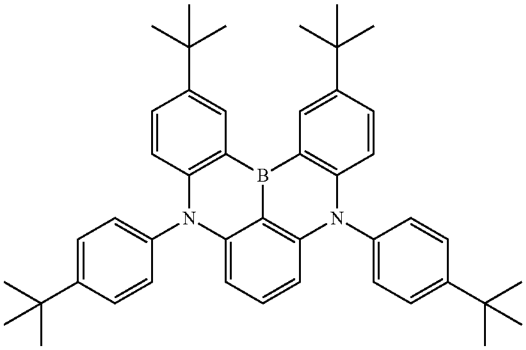
4-4
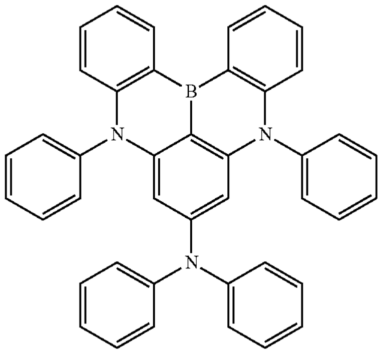
4-5
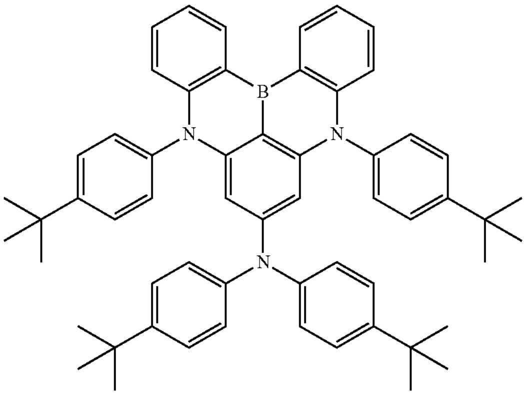
4-6
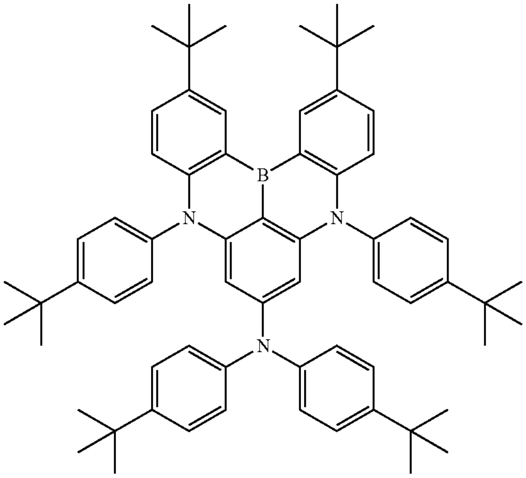

-continued 4-7

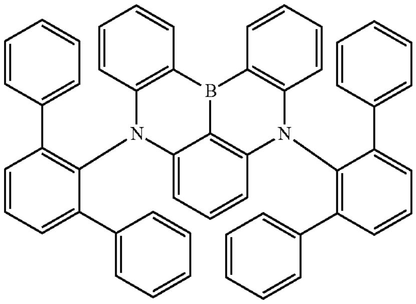

4-8

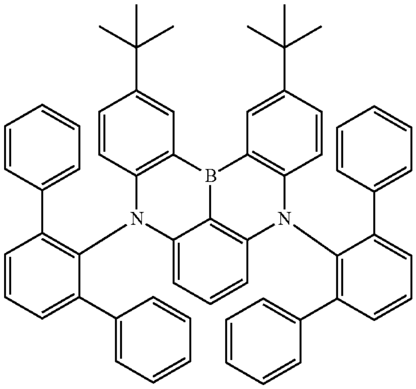

4-9

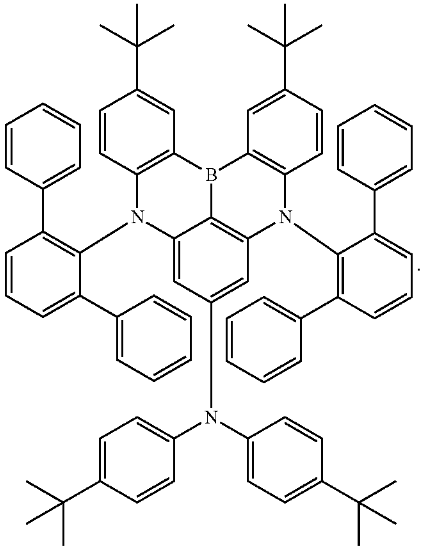

6. The organic light emitting diode of claim 1, wherein the emissive layer comprises a first emitting part disposed between the first and second electrodes, a second emitting part disposed between the first emitting part and the second electrode, and a first charge generation layer disposed between the first and second emitting parts, and wherein at least one of the first emitting part and the second emitting part comprises the emitting material layer.

7. The organic light emitting diode of claim 6, wherein the first emitting part comprises the emitting material layer.

8. The organic light emitting diode of claim 6, wherein the second emitting part comprises a blue fluorescent emitting material layer, a blue phosphorescent emitting material layer, a blue delayed fluorescent emitting material layer or the emitting material layer.

9. The organic light emitting diode of claim 6, wherein the emissive layer further comprises a third emitting part disposed between the second emitting part and the second electrode, and a second charge generation layer disposed between the second and third emitting parts.

10. The organic light emitting diode of claim 9, wherein at least one of the first emitting part and the third emitting part comprises the emitting material layer.

11. The organic light emitting diode of claim 9, wherein the second emitting part comprises at least one of a green emitting material layer, a yellow green emitting material layer, and a red emitting material layer.

12. An organic light emitting device, comprising:

a substrate; and the organic light emitting diode according to claim 1 and disposed over the substrate.

13. An organic light emitting display device, comprising:

a substrate; and a display comprising an array of pixels on the substrate, wherein each pixel comprises one or more individually addressable organic light emitting diodes according to claim 1.

14. An organic light emitting diode comprising:

a first electrode;

a second electrode facing the first electrode; and an emissive layer disposed between the first and second electrodes and comprising at least one emitting material layer, wherein the at least one emitting material layer comprises a first emitting material layer and a second emitting material layer, wherein the second emitting material layer is disposed adjacent to the first emitting material layer, wherein the first emitting material layer comprises a first compound having the following structure of Formula 1 and a second compound having the following structure of Formula 3, and wherein the second emitting material layer comprises a third compound having the following structure of Formula 5 and a fourth compound having the following structure of Formula 7:

[Formula 1]

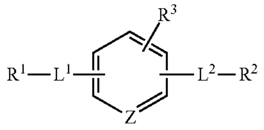

wherein, in Formula 1, each of $R^1$ and $R^2$ is independently an unsubstituted or substituted carbazolyl;

$R^3$ is hydrogen, cyano, an unsubstituted or substituted phenyl, an unsubstituted or substituted pyridyl, or an unsubstituted or substituted $C_1$-$C_4$ alkyl;

Z is N or $CR^4$, wherein $R^4$ is hydrogen or unsubstituted or substituted $C_1$-$C_4$ alkyl; and each of $L^1$ and $L^2$ is independently a single bond, unsubstituted or substituted carbazolyl or an unsubstituted or substituted phenyl,

[Formula 3]

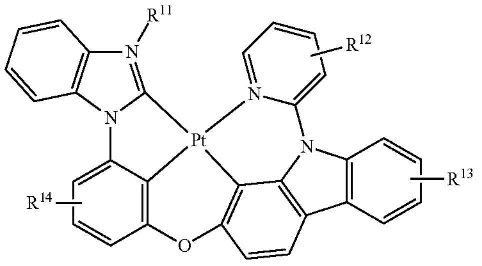

wherein, in Formula 3, each of $R^{11}$ to $R^{14}$ is independently hydrogen, halogen, cyano, unsubstituted or substituted $C_1$-$C_4$ alkyl, unsubstituted or substituted phenyl, unsubstituted or substituted pyridyl, or unsubstituted or substituted adamantyl,

[Formula 5]

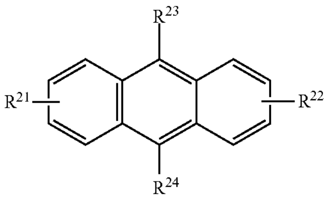

wherein, in Formula 5, each of $R_{21}$ and $R_{22}$ is independently hydrogen, unsubstituted or substituted $C_1$-$C_8$ alkyl, or unsubstituted or substituted $C_6$-$C_{10}$ aryl; and each of $R^{23}$ and $R^{24}$ is independently unsubstituted or substituted $C_6$-$C_{30}$ aryl,

[Formula 7]

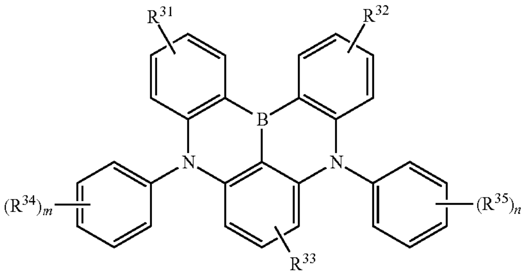

wherein, in Formula 7, each of $R^{31}$ to $R^{33}$ is independently hydrogen, unsubstituted or substituted $C_1$-$C_{20}$ alkyl, or unsubstituted or substituted $C_6$-$C_{30}$ aryl amino;

each of $R^{34}$ and $R^{35}$ is independently unsubstituted or substituted $C_1$-$C_{20}$ alkyl, or unsubstituted or substituted $C_6$-$C_{30}$ aryl, wherein $R^{34}$ is identical to or different from each other when m is an integer of two or more and each $R^{35}$ is identical to or different from each other when n is an integer of two or more; and each of m and n is independently an integer of 0 to 5.

15. The organic light emitting diode of claim 14, wherein in Formula 1, each of $R^1$ and $R^2$ is independently an unsubstituted carbazolyl.

16. The organic light emitting diode of claim 14, wherein in Formula 1, Z is N or $CR^4$, wherein $R^4$ is hydrogen or unsubstituted or substituted $C_1$-$C_4$ alkyl.

17. The organic light emitting diode of claim 14, wherein in Formula 1, each of $L^1$ and $L^2$ is independently a single bond, unsubstituted carbazolyl or an unsubstituted or substituted phenyl.

18. The organic light emitting diode of claim 14, wherein in Formula 3, each of $R^{11}$ to $R^{14}$ is independently hydrogen, unsubstituted or substituted $C_1$-$C_4$ alkyl, unsubstituted or substituted phenyl, or unsubstituted or substituted adamantly.

19. The organic light emitting diode of claim 14, wherein in Formula 5, each of $R^{21}$ and $R^{22}$ is independently hydrogen, or an unsubstituted or substituted $C_1$-$C_4$ alkyl, and/or each of $R^{23}$ and $R^{24}$ is independently unsubstituted or substituted naphthalene.

20. The organic light emitting diode of claim 14, wherein in Formula 7, each of $R^{31}$ and $R^{32}$ is independently hydrogen, or an unsubstituted or substituted $C_1$-$C_8$ alkyl, and/or each of $R^{34}$ and $R^{35}$ is independently unsubstituted or substituted $C_1$-$C_8$ alkyl.

21. The organic light emitting diode of claim 14, wherein in Formula 7, at least one of $R^{31}$, $R^{32}$, $R^{34}$ and $R^{35}$ is independently t-butyl and/or $R^{33}$ is a bis(4-(tert-butyl)phenyl)amine.

22. The organic light emitting diode of claim 14, wherein in Formula 7, each of $R^{34}$ and $R^{35}$ is unsubstituted phenyl.

* * * * *